(12) United States Patent
Hwang et al.

(10) Patent No.: US 9,812,356 B2
(45) Date of Patent: Nov. 7, 2017

(54) METHOD FOR MANUFACTURING A SEMICONDUCTOR DEVICE

(71) Applicant: SAMSUNG ELECTRONICS CO., LTD., Suwon-si, Gyeonggi-do (KR)

(72) Inventors: Sung Wook Hwang, Gyeongsangbuk-do (KR); Jong Hyun Lee, Suwon-si (KR); Jae Seok Yang, Hwaseong-si (KR); In Wook Oh, Suwon-si (KR); Hyun Jae Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/405,762

(22) Filed: Jan. 13, 2017

(65) Prior Publication Data
US 2017/0271204 A1    Sep. 21, 2017

(30) Foreign Application Priority Data
Mar. 21, 2016   (KR) ........................ 10-2016-0033139

(51) Int. Cl.
H01L 23/528   (2006.01)
H01L 21/768   (2006.01)
G06F 17/50    (2006.01)

(52) U.S. Cl.
CPC .... *H01L 21/76879* (2013.01); *G06F 17/5072* (2013.01); *H01L 21/76804* (2013.01); *H01L 21/76826* (2013.01); *H01L 21/76832* (2013.01)

(58) Field of Classification Search
CPC .. H01L 21/76816; H01L 23/528; G06F 17/50
See application file for complete search history.

(56) References Cited

U.S. PATENT DOCUMENTS 7,200,831 B2    4/2007  Kitabayashi
8,225,240 B2    7/2012  Tahata
(Continued)

FOREIGN PATENT DOCUMENTS

JP    2013-157498    8/2013
KR    10-2005-0066847    6/2005
(Continued)

*Primary Examiner* — Mohammad Choudhry
(74) *Attorney, Agent, or Firm* — F. Chau & Associates, LLC

(57) ABSTRACT

A method for manufacturing a semiconductor device includes generating a layout including a first conductive pattern region and a second conductive pattern region. A first interlayer insulating film is formed on a substrate, the first interlayer insulating film including a first region corresponding to the first conductive pattern region, a second region corresponding to the second conductive pattern region, and a third region spaced apart from the first and second regions and disposed between the first and second regions. First, second and third lower metal wirings are formed to respectively fill the first, second and third recesses of the first interlayer insulating film. A second interlayer insulating film is formed on the first interlayer insulating film. A first dummy via hole is formed in the second interlayer insulating film to expose the third lower metal wiring. The third lower metal wiring is electrically isolated.

20 Claims, 30 Drawing Sheets

(56) References Cited

U.S. PATENT DOCUMENTS

| | | |
|---|---|---|
| 8,283,701 B2 | 10/2012 | Becker et al. |
| 2011/0001243 A1 | 1/2011 | Sel et al. |
| 2013/0043596 A1* | 2/2013 | Inoue ................. G06F 17/5068 257/773 |
| 2013/0106290 A1 | 5/2013 | Chung et al. |
| 2015/0072531 A1 | 3/2015 | Tung |
| 2015/0091188 A1 | 4/2015 | Lee et al. |

FOREIGN PATENT DOCUMENTS

| | | |
|---|---|---|
| KR | 10-2008-0081653 | 9/2008 |
| KR | 10-2009-0000441 | 1/2009 |

\* cited by examiner

METHOD FOR MANUFACTURING A SEMICONDUCTOR DEVICE

CROSS-REFERENCE TO RELATED APPLICATION

This application claims priority under 35 U.S.C. §119 to Korean Patent Application No. 10-2016-0033139, filed in the Korean Intellectual Property Office on Mar. 21, 2016, the disclosure of which is incorporated by reference herein in its entirety.

TECHNICAL FIELD

The present inventive concept relates to a method for manufacturing a semiconductor device.

DISCUSSION OF THE RELATED ART

Highly downsized and highly integrated semiconductor elements may be achieved by forming semiconductor elements having small patterns that are spaced closely to each other.

With the downsizing of semiconductor devices, a size of vias that connect wirings disposed on different layers has decreased. When the size of the vias decreases, a density difference between isolation vias and dense vias may increase. Further, when the number of isolation vias increases, a process margin may drop. In addition, when forming a dummy via to reduce the density difference, a parasitic capacitance may increase.

SUMMARY

The present inventive concept relates to method for manufacturing a semiconductor device having an increased via density, by using a metal wiring to form vias that do not conduct electricity. The wiring or wires may be generated by a self-aligned double pattern (SADP) process.

According to an exemplary embodiment of the present inventive concept, a method for manufacturing a semiconductor device includes generating a layout including a first conductive pattern region and a second conductive pattern region spaced apart from each other in a first direction. A first interlayer insulating film is formed on a substrate, the first interlayer insulating film including a first region corresponding to the first conductive pattern region, a second region corresponding to the second conductive pattern region, and a third region spaced apart from the first and second regions. The third region is disposed between the first and second regions. A first block pattern and a second block pattern are formed on the first interlayer insulating film, the first block pattern being disposed between the first region and the third region, and the second block pattern being disposed between the second region and the third region. The first interlayer insulating film is partially removed using the first block pattern and the second block pattern as a mask to form a first recess in the first region, a second recess in the second region, and a third recess in the third region. First, second and third lower metal wirings are formed to respectively fill the first, second and third recesses. A second interlayer insulating film is formed on the first interlayer insulating film. A first dummy via hole is formed in the second interlayer insulating film, the first dummy via hole exposing a top surface of the third lower metal wiring. The first dummy via hole does not overlap the first lower metal wiring and the second lower metal wiring. The layout does not include a conductive pattern region corresponding to the third region. The third lower metal wiring is electrically isolated. A distance between the first lower metal wiring and the second lower metal wiring is greater than a sum of a width of the first block pattern, a width of the second block pattern and a width of the first dummy via hole.

According to an exemplary embodiment of the present inventive concept, a method for manufacturing a semiconductor device includes generating a layout including a first conductive pattern region, a second conductive pattern region, a third conductive pattern region and a fourth conductive pattern region, the first conductive pattern region and the second conductive pattern region being spaced apart from each other in a first direction, and the third conductive pattern region and the fourth conductive pattern region being spaced apart from the first conductive pattern region and the second conductive pattern region in a second direction crossing the first direction. The third and fourth conductive pattern regions are spaced part from each other in the first direction. A first interlayer insulating film is formed on a substrate. A first protrusion, a second protrusion, a third protrusion and a fourth protrusion are formed on the first interlayer insulating film, the second protrusion being spaced apart from the first protrusion in the first direction, the fourth protrusion being spaced apart from the third protrusion in the first direction. The third protrusion and the fourth protrusion are spaced apart from the first protrusion and the second protrusion in the second direction. A first lower metal wiring, a second lower metal wiring, a third lower metal wiring, a fourth lower metal wiring, a fifth lower metal wiring and a sixth lower metal wiring are formed on the first interlayer insulating film, the first lower metal wiring corresponding to the first conductive pattern region, the second lower metal wiring corresponding to the second conductive pattern region, the fourth lower metal wiring corresponding to the third conductive pattern region, the fifth lower metal wiring corresponding to the fourth conductive pattern region. The third lower metal wiring is disposed between the first protrusion and the second protrusion and the sixth lower metal wiring is disposed between the third protrusion and the fourth protrusion. A second interlayer insulating film is formed on the first interlayer insulating film. A first dummy via hole is formed in the second interlayer insulating film, the first dummy via hole exposing a top surface of the third lower metal wiring. The first dummy via hole does not overlap the first lower metal wiring and the second lower metal wiring. The third lower metal wiring and the sixth lower metal wiring do not conduct electricity. Each of the third lower metal wiring and the sixth lower metal wiring is electrically isolated. A distance between the first lower metal wiring and the second lower metal wiring is greater than a sum of a width of the first protrusion, a width of the second protrusion and a width of the first dummy via hole.

According to an exemplary embodiment of the present inventive concept, a method for manufacturing a semiconductor device includes generating a layout of a semiconductor device, the layout including a first region, a second region and a third region spaced apart from each other in a first direction, wherein the third region is disposed between the first and second regions. A first interlayer insulating film is formed on a substrate. A first recess is formed in a first area of the interlayer insulating film corresponding to the first region, a second recess is formed in a second area of the interlayer insulating film corresponding to the second region, and a third recess is formed in a third area of the interlayer insulating film corresponding to the third region. First, second and third lower metal wirings are formed to respectively fill the first, second and third recesses. A second interlayer insulating film is formed on the first interlayer insulating film to cover the first, second and third lower metal wirings. A first trench is formed on the second interlayer insulating film, the first trench including a first dummy via hole which the third lower metal wiring. The first dummy via hole does not overlap the first lower metal wiring and the second lower metal wiring. A first upper metal wiring is formed to fill the first trench and the first dummy via hole. The first upper metal wiring is electrically connected with the third lower metal wiring through the first dummy via hole. The third lower metal wiring does not conduct electricity. A distance in the first direction between the first lower metal wiring and the second lower metal wiring is greater than a sum of a width of the first block pattern in the first direction, a width of the second block pattern in the first direction and a width of the first dummy via hole in the first direction.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

The methods of FIGS. 1 to 29 may include using a self-aligned double patterning (SADP) process to form patterns (e.g., metal wirings or metal wires). However, it is to be understood that the present inventive concept is not limited thereto. A method for manufacturing a semiconductor device, according to one or more exemplary embodiments of the present inventive concept, may include using other patterning processes, for example, a (self-aligned quadruple patterning) SAQP process to form patterns.

Hereinafter, a method for manufacturing a semiconductor device, according to an exemplary embodiment of the present inventive concept, will be described with reference to FIGS. 1 through 18.

Figure 1:
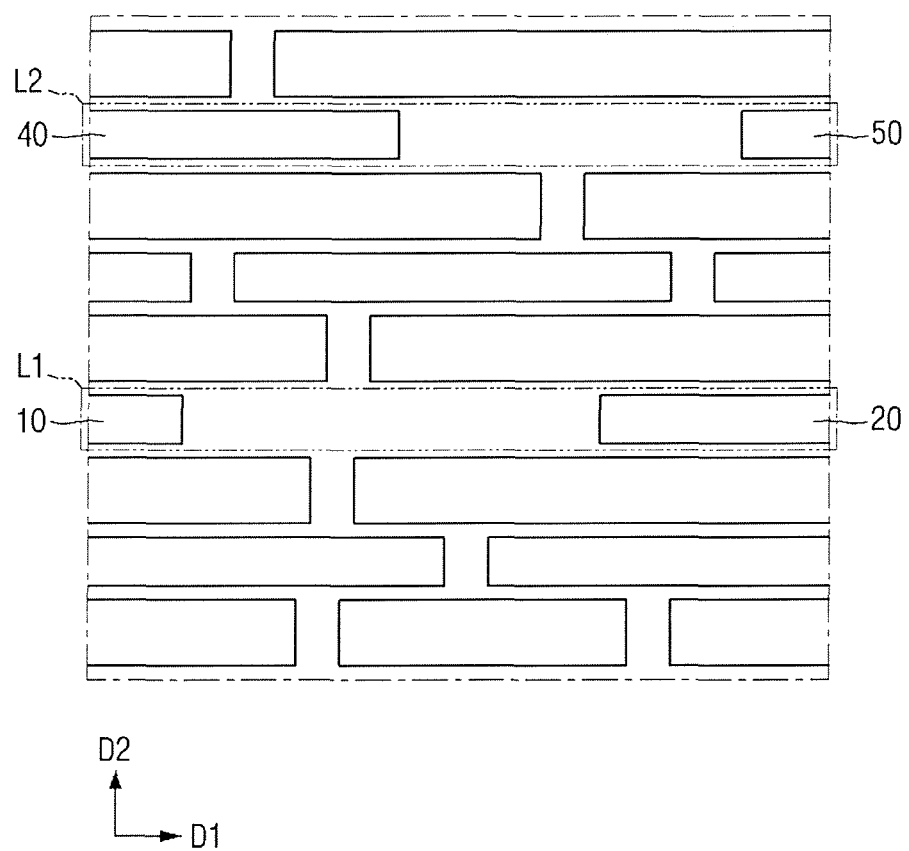
FIGS. 1 through 29 are plan and cross-sectional views illustrating methods for manufacturing a semiconductor device according to exemplary embodiments of the present inventive concept.

FIG. 1 is a layout diagram (e.g., a plan view) used in one or more methods for manufacturing a semiconductor device, according to exemplary embodiments of the present inventive concept. FIGS. 2 to 18 are plan and cross-sectional views of a method for manufacturing a semiconductor device, according to an exemplary embodiment of the present inventive concept. FIGS. 2, 5, 9, 13, 15 and 17 are plan views. FIGS. 3, 4, 6, 7 and 8 are cross-sectional views taken along the line A-A' of FIG. 2. FIGS. 10, 11, 12, 14, 16 and 18 are cross-sectional views taken along the line B-B' and the line C-C' of FIG. 9.

Referring to FIG. 1, a layout of patterns to be generated on a substrate may include a first conductive pattern region 10, a second conductive pattern region 20, a third conductive pattern region 40 and a fourth conductive pattern region 50.

The first conductive pattern region 10 and the second conductive pattern region 20 may be spaced apart from each other in a first direction D1. The third conductive pattern region 40 and the fourth conductive pattern region 50 may be spaced apart from each other in the first direction D1.

The first and third conductive pattern regions 10 and 40 may be spaced apart from one another in a second direction D2. The second and fourth conductive pattern region 20 and 50 may be spaced apart from one another in the second direction D2.

The plan view of FIG. 1 may be a layout diagram illustrating lower metal wirings to be patterned on a substrate. The layout diagram may be, for example, a graphics data system (GDS) file.

Figure 2:
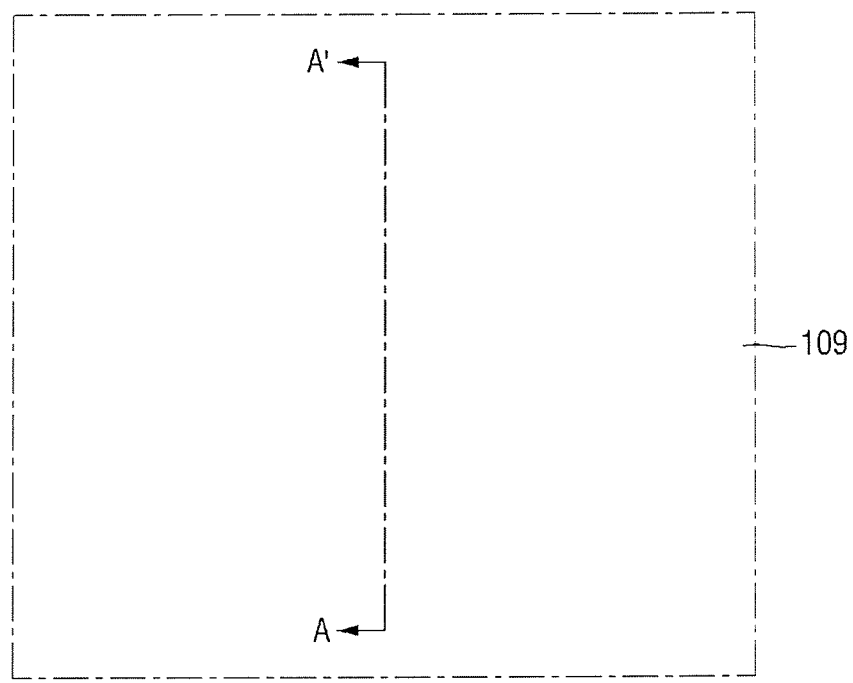
Figure 2:
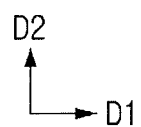
Figure 3:
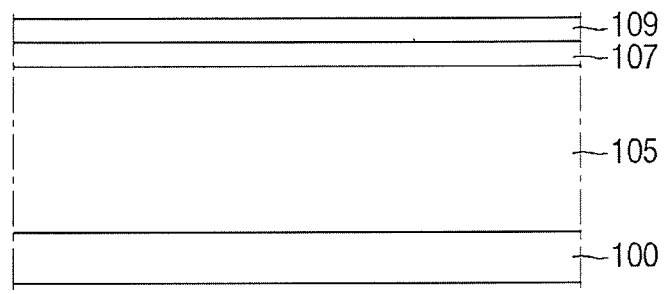

Referring to FIGS. 2 and 3, a first interlayer insulating film 105, a barrier film 107 and a hard mask 109 may be successively formed on a substrate 100.

The substrate 100 may include, for example, bulk silicon or silicon-on-insulator (SOI). Alternatively, the substrate 100 may include silicon or contain other materials, e.g., silicon germanium, indium antimonide, lead telluride, indium arsenide, indium phosphide, gallium arsenide or gallium antimonide. In addition, the substrate 100 may be obtained by an epitaxial layer formed on a base substrate.

The substrate 100 may include a field insulating film. The field insulating film may include, for example, a silicon oxide film, a silicon nitride film or a silicon oxynitride film.

The first interlayer insulating film 105 may be formed on the substrate 100. The first interlayer insulating film 105 may include, for example, a low dielectric constant material, an oxide film, a nitride film or an oxynitride film to reduce a coupling effect between wirings. The low dielectric constant material may include, for example, but is not limited to, flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material or a combination thereof.

The first interlayer insulating film 105 may be formed, for example, by using a chemical vapor deposition (CVD) process, a spin coating process, a plasma enhanced CVD (PECVD) process, or a high density plasma CVD (HDP-CVD) process.

The barrier film 107 may be formed on the first interlayer insulating film 105. The barrier film 107 may include, for example, silicon nitride, silicon oxide or silicon oxynitride.

The hard mask 109 may be formed on the barrier film 107. The hard mask 109 may include a metal nitride. For example, the hard mask 109 may include titanium nitride, tantalum nitride and/or tungsten nitride. Although FIGS. 2 and 3 illustrate the hard mask 109 as a single layer, the present inventive concept is not limited thereto. For example, the hard mask 109 may be formed by laminating two or more layers.

The barrier film 107 and the hard mask 109 may be formed, for example, by processes such as atomic layer deposition (ALD), CVD or a spin coating. A baking process and a curing process may be performed as needed, depending on the materials included in the barrier film 107 and the hard mask 109.

Figure 4:
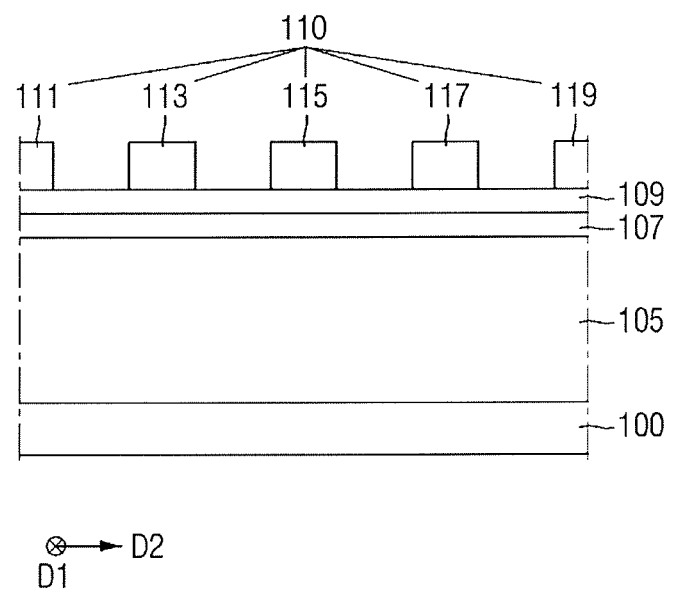
Figure 5:
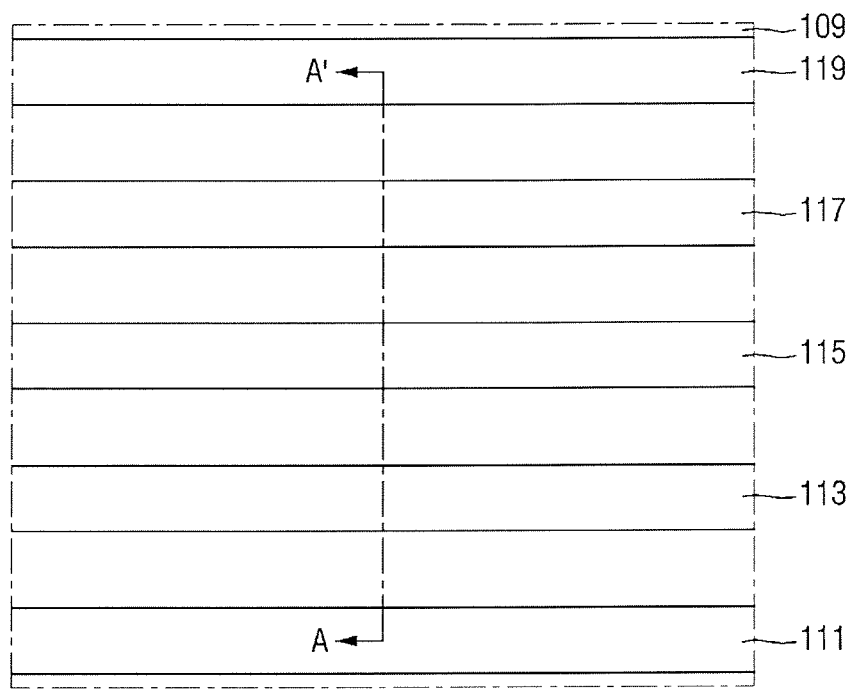

Referring to FIGS. 4 and 5, a mold mask pattern 110 may be formed on the hard mask 109. The mold mask pattern 110 may be formed to extend in the first direction D1.

A plurality of mold mask patterns 110 may be formed on the hard mask 109. Although FIGS. 4 and 5 illustrate the mold mask pattern 110 including five first to fifth mold mask patterns 111, 113, 115, 117 and 119, as an example, the present inventive concept is not limited thereto. For example, the mold mask pattern 110 may also include four or less or six or more patterns.

The first to fifth mold mask patterns 111, 113, 115, 117 and 119 may be formed to be spaced apart from one another. For example, the first to fifth mold mask patterns 111, 113, 115, 117 and 119 may be spaced apart from one another in the second direction D2. Distances by which the first to fifth mold mask patterns 111, 113, 115, 117 and 119 are spaced apart from one another may be all the same, partially the same, or all different from one another.

The widths of the first to fifth mold mask patterns 111, 113, 115, 117 and 119 in the second direction D2 may be all the same, partially the same, or all different from one another.

Figure 6:
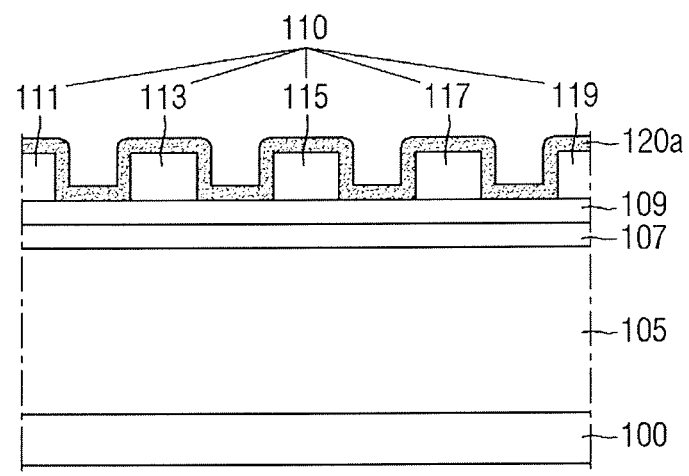

Referring to FIG. 6, a spacer film 120a may be formed to cover the plurality of mold mask patterns 110. The spacer film 120a may cover the top surfaces and side walls of the plurality of mold mask patterns 110.

The spacer film 120a may include, for example, silicon oxide.

Figure 7:
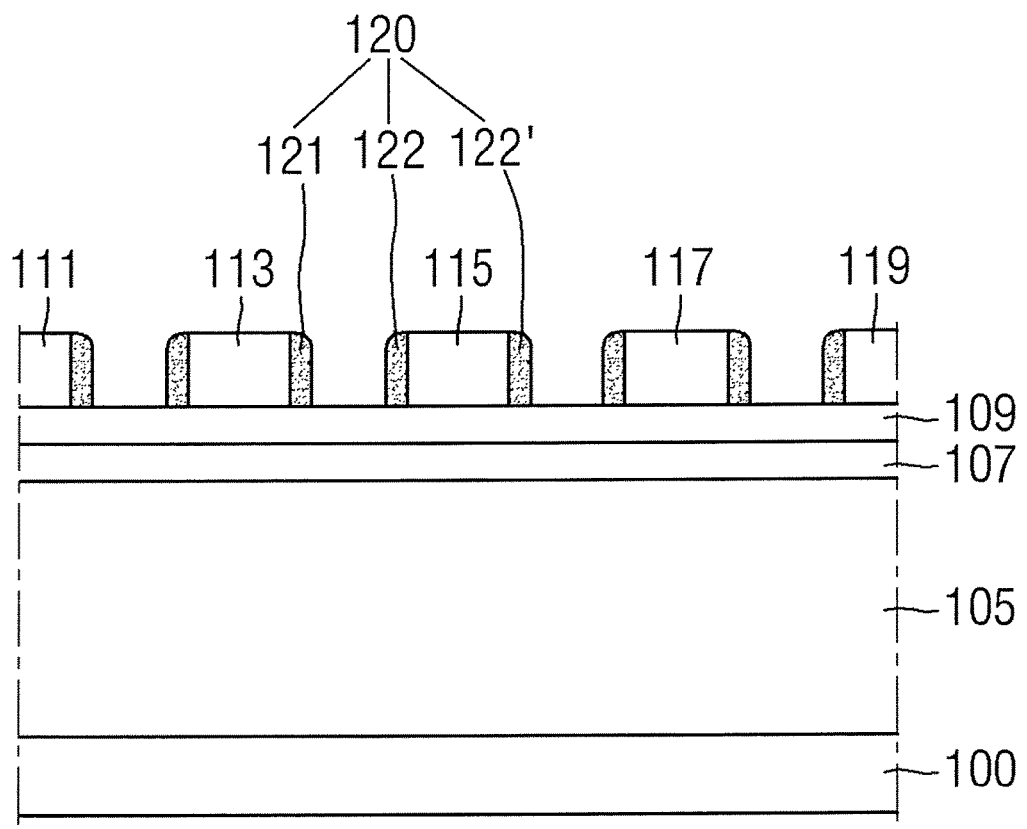

Referring to FIG. 7, a plurality of spacers 120 may be formed by an etch-back of the spacer film 120a. For example, a pair of spacers 120 may be formed on both side walls of the first to fifth mold mask patterns 111 to 119. For example, a first spacer 121 may be formed on a side wall of the second mold mask pattern 113. In addition, a second spacer 122 and a second spacer 122' may be formed on both side walls of the third mold mask pattern 115.

Each of the spacers 120 is formed to extend in the first direction D1 and may be formed to be spaced apart from each other in the second direction D2.

Figure 8:
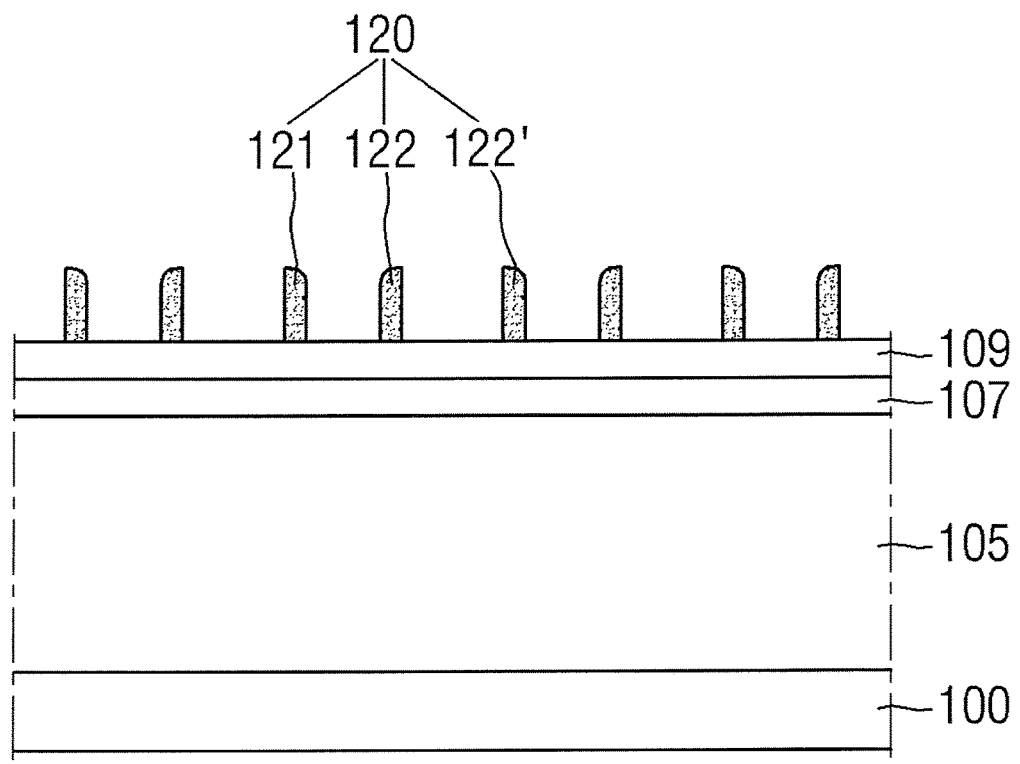

Referring to FIG. 8, the mold the mask pattern 110 may be removed. The first to fifth mold mask patterns 111, 113, 115, 117 and 119 are removed, and only the plurality of spacers 120 may be left on the hard mask 109. When the mold mask pattern 110 is removed, the hard mask 109 located at the bottom of the mold mask pattern 110 may be exposed.

Figure 9:
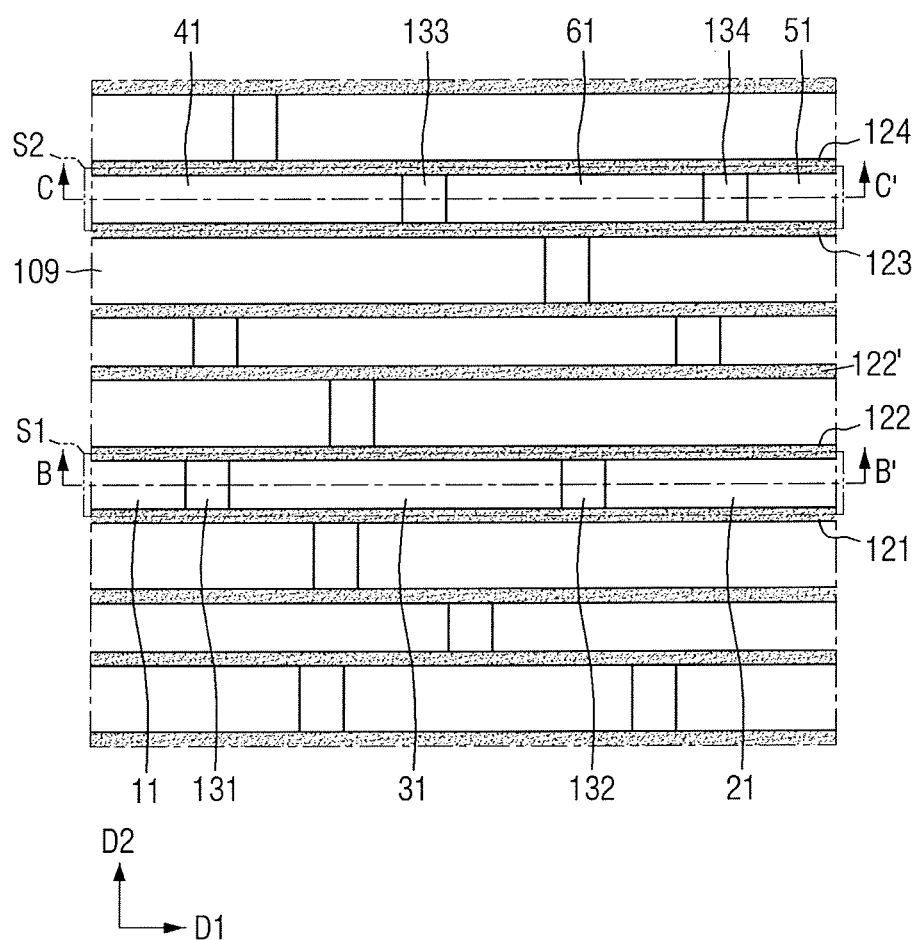

Referring to FIG. 9, the spacer 120 may further include a third spacer 123 and a fourth spacer 124. The first spacer 121 and the second spacer 122 may be, for example, formed in a region S1 on the substrate 100. The third spacer 123 and the fourth spacer 124 may be, for example, formed in a region S2 on the substrate 100. Each of the first to fourth spacers 121 to 124 may be spaced apart from each other in the second direction D2.

A first region 11, a second region 21 and a third region 31 may be exposed between the first spacer 121 and the second spacer 122. Further, a fourth region 41, a fifth region 51 and a sixth region 61 may be formed between the third spacer 123 and the fourth spacer 124. The first region 11, the second region 21 and the third region 31 may be spaced apart from each other in the first direction D1. The fourth region 41, the fifth region 51 and the sixth region 61 may be spaced apart from each other in the first direction D1. The first region 11, the second region 21 and the third region 31 may be spaced apart from and the fourth region 41, the fifth region 51 and the sixth region 61 in the second direction D2.

In the drawings, the spacers 120 for exposing the first region 11, the second region 21 and the third region 31 are illustrated as spacers formed between the second mold mask pattern 113 and the third mold mask patterns 115 of FIG. 7, but the present inventive concept is not limited thereto. For example, the spacers 120 for exposing the first region 11, the second region 21 and the third region 31 may be a pair of spacers formed on the side walls of one of the plurality of mold mask patterns 110.

A first block pattern 131 to a fourth block pattern 134 may be formed on the first interlayer insulating film 105. For example, the first block pattern 131 to the fourth block pattern 134 may be formed on the hard mask 109.

The first block pattern 131 and the second block pattern 132 may be formed, for example, between the first spacer 121 and the second spacer 122. The third block pattern 133 and the fourth block pattern 134 may be formed, for example, between the third spacer 123 and the fourth spacers 124. The first to fourth block patterns 131 to 134 may be formed as needed based on the layout (e.g., the layout of FIG. 1) of the metal wirings to be formed on the substrate 100.

A plurality of block patterns may be formed on the substrate 100. For example, in addition to the first to fourth block patterns 131 to 134, a block pattern may also be formed between the second spacer 122 and the second spacer 122'.

Figure 10:
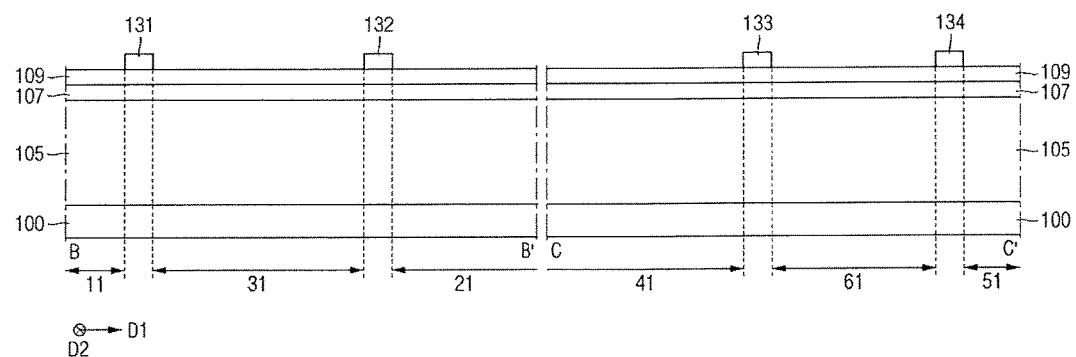

Referring to FIG. 10, the first to sixth regions 11, 21, 31, 41, 51 and 61 may be partitioned by the first to fourth block patterns 131 to 134. Here, the first to sixth regions 11, 21, 31, 41, 51 and 61 may be regions included in the first interlayer insulating film 105.

Referring to FIG. 1, the first region 11 may be a region corresponding to the first conductive pattern region 10. The second region 21 may be a region corresponding to the second conductive pattern region 20. The fourth region 41 may be a region corresponding to the third conductive pattern region 40. The fifth region 51 may be a region corresponding to the fourth conductive pattern region 50.

The layout of FIG. 1 may not include a conductive pattern region corresponding to the third region 31. In other words, if a pattern is formed in the third region 31, the pattern does not conduct electricity. Further, the layout of FIG. 1 may not include a conductive pattern region corresponding to the sixth region 61. In other words, if a pattern is formed in the sixth region 61, the pattern does not conduct electricity.

The first block pattern 131 may be formed on the first interlayer insulating film 105, between the first region 11 and the third region 31. The second block pattern 132 may be formed on the first interlayer insulating film 105, between the second region 21 and the third region 31. The third block pattern 133 may be formed on the first interlayer insulating film 105, between the fourth region 41 and the sixth region 61. The fourth block pattern 134 may be formed on the first interlayer insulating film 105, between the fifth region 51 and the sixth region 61.

The first block pattern 131 to the fourth block pattern 134 may include, for example, a silicon-containing material such as silicon oxide (SiOx), silicon oxynitride (SiON), silicon nitride (SixNy), tetraethylothosilicate (TEOS) or polycrystalline silicon, a carbon-containing material such as an amorphous carbon layer (ACL), bottom of anti-reflection coating (BARC) or a spin-on hardmask (SOH) or a metal.

The first block pattern 131 to the fourth block pattern 134 may be formed, for example, by a process such as the ALD, the CVD, or by a spin coating and an etching process.

Figure 11:
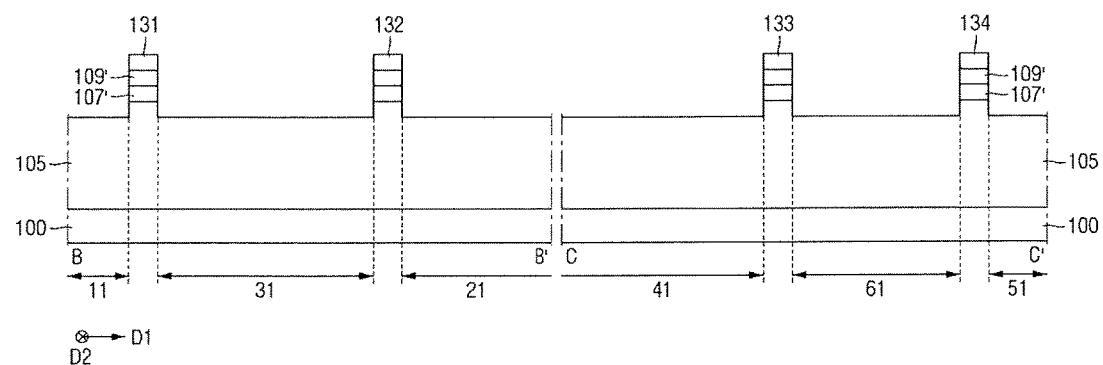
Figure 12:
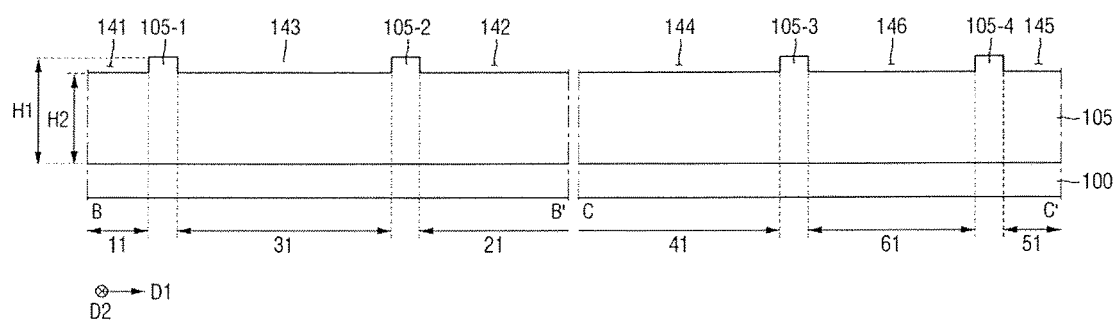

Referring to FIGS. 11 and 12, the first interlayer insulating film 105 is partially removed, and a first recess 141 to a sixth recess 146 may be formed.

By using the first block pattern 131 to the fourth block pattern 134 as a mask, the hard mask 109, the barrier film 107 and the first interlayer insulating film 105 may be partially removed. As a result, a hard mask pattern 109', a barrier pattern 107', a first recess 141 to a sixth recess 146, and a first protrusion 105-1 to a fourth protrusion 105-4 may be formed.

The first recess 141 to the sixth recess 146 may be formed in the first interlayer insulating film 105, by the partial removal of the first interlayer insulating film 105. The bottom surfaces of the first recess 141 to the sixth recess 146 may be defined by the first interlayer insulating film 105. The side walls of the first recess 141 to the sixth recess 146 may be defined by the first protrusion 105-1 to the fourth protrusion 105-4. After forming the first recess 141 to the sixth recess 146, the hard mask pattern 109' and the barrier pattern 1, 07' may be removed, forming the first protrusion 105-1 to the fourth protrusion 105-4.

By the removal of the hard mask pattern 109' and the barrier pattern 107', the first protrusion 105-1 to the fourth protrusion 105-4 may be exposed.

The first protrusion 105-1 may be formed on the first interlayer insulating film 105 between the first region 11 and the third region 31. The second protrusion 105-2 may be formed on the first interlayer insulating film 105 between the second region 21 and the third region 31. The second protrusion 105-2 may be spaced apart from the first protrusion 105-1 in the first direction D1. The third protrusion 105-3 may be formed on the first interlayer insulating film 105 between the fourth region 41 and the sixth region 61. The third protrusion 105-3 may be spaced apart from the first protrusion 105-1 and the second protrusion 105-2 in the second direction D2. The fourth protrusion 105-4 may be formed on the first interlayer insulating film 105 between the fifth region 51 and the sixth region 61. The fourth protrusion 105-4 may be spaced apart from the third protrusion 105-3 in the first direction D1. The fourth protrusion 105-4 may be spaced apart from the first protrusion 105-1 and the second protrusion 105-2 in the second direction D2.

The first protrusion 105-1 to the fourth protrusions 105-4 may be portions of the first interlayer insulating film 105 that protrude from the top surface of the first interlayer insulating film 105. In other words, a height H1 from the substrate 100 to the top surfaces of the first protrusion 105-1 to the fourth protrusion 105-4 may be greater than a height H2 from the substrate 100 to the top surface of the first interlayer insulating film 105.

The first protrusion 105-1 to the fourth protrusion 105-4 may include the same material as the first interlayer insulating film 105.

Figure 13:
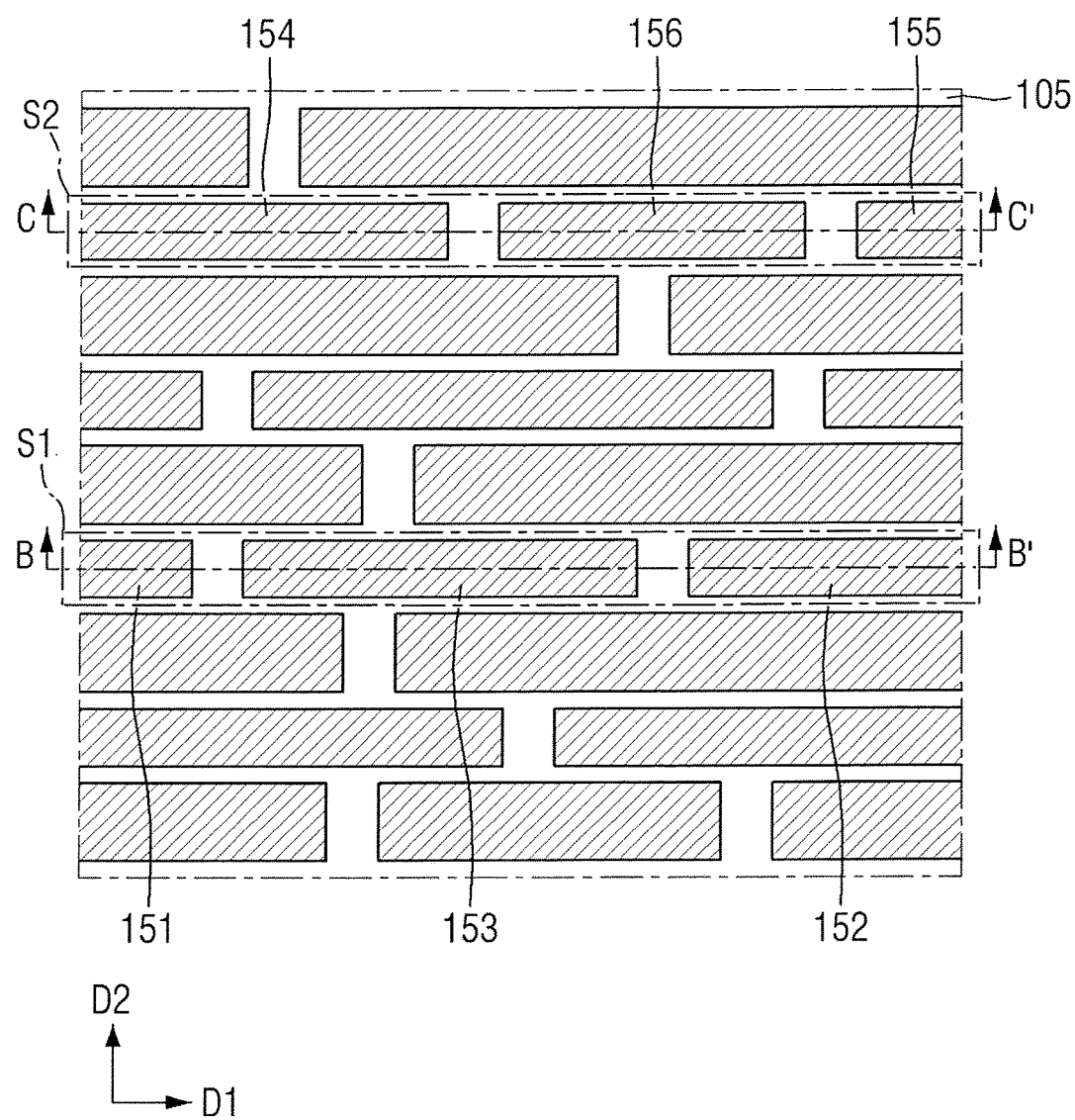
Figure 14:
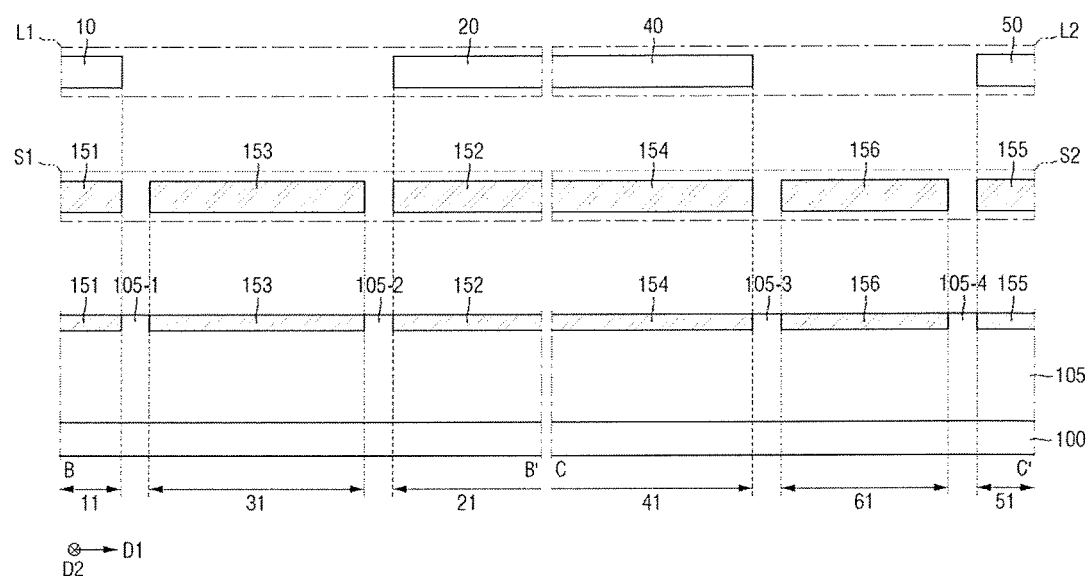

Referring to FIGS. 13 and 14, a first lower metal wiring 151 to a sixth lower metal wiring 156 may be formed on the first interlayer insulating film 105.

The first lower metal wiring 151 to the third lower metal wiring from 153 may be, for example, wirings formed in the region S1 of the substrate 100. The fourth lower metal wiring 154 to the sixth lower metal wiring 156 may be, for example, wirings formed in the region S2 of the substrate 100. The region S1 and the region S2 may be arbitrary regions of the substrate 100 that are spaced apart from each other in the second direction D2.

Referring to FIGS. 1 and 13, the first lower metal wiring 151 to the third lower metal wiring 153 may be, for example, wirings formed in the region L1 of the layout diagram of FIG. 1. The fourth lower metal wiring 154 to the sixth lower metal wiring 156 may be, for example, wirings formed in the region L2 of the layout diagram of FIG. 1. The region L1 and the region L2 may be arbitrary regions of the layout diagram of FIG. 1, spaced apart from each other in the second direction D2.

The first lower metal wiring 151 may be a metal wiring corresponding to the first conductive pattern region 10 of the region L1. The second lower metal wiring 152 may be a metal wiring corresponding to the second conductive pattern region 20 of the region L1.

The region L1 of the layout diagram of FIG. 1 may not include a conductive pattern region corresponding to the third lower metal wiring 153. For example, the layout diagram of FIG. 1 may not include a conductive pattern region corresponding to the third region 31. In other words, the third lower metal wiring 153 does not conduct electricity. The third lower metal wiring 153 may be formed between the first protrusion 105-1 and the second protrusion 105-2.

The fourth lower metal wiring 154 may be a metal wiring corresponding to the third conductive pattern region 40 of the region L2. The fifth lower metal wiring 155 may be a metal wiring corresponding to the fourth conductive pattern region 50 of the region L2.

The region L2 of the layout diagram of FIG. 1 may not include a conductive pattern region corresponding to the sixth lower metal wiring 156. For example, the layout diagram of FIG. 1 may not include a conductive pattern region corresponding to the sixth region 61. In other words, the sixth lower metal wiring 156 does not conduct electricity. The sixth lower metal wiring 156 may be formed between the third protrusion 105-3 and the fourth protrusion 105-4.

The first lower metal wiring 151 to the sixth lower metal wiring 156 may be respectively formed by filling each of the first recess 141 to the sixth recess 146.

The first lower metal wiring 151 to the sixth lower metal wiring 156 may include, for example, a conductive material. The first lower metal wiring 151 to the sixth lower metal wiring 156 may include, for example, tungsten (W), aluminium (Al), copper (Cu), cobalt (Co) or a copper alloy. Here, the copper alloy may include C (carbon), Ag (silver), Co (cobalt), Ta (tantalum), In (indium), Sn (tin), Zn (zinc), Mn (manganese), Ti (titanium), Mg (magnesium), Cr (chromium), Ge (germanium), Sr (strontium), Pt (platinum), Al (aluminium) or Zr (zirconium) in the copper.

In a method for manufacturing the semiconductor device, according to an exemplary embodiment of the present inventive concept, although the first lower metal wiring 151 to the sixth lower metal wiring 156 are described as being metal wirings, the first lower metal wiring 151 to the sixth lower metal wiring 156 may be included, for example, in a transistor, a diode or the like, formed on the substrate 100. For example, the first lower metal wiring 151 to the sixth lower metal wiring 156 may be a gate electrode of a transistor or a source/drain of a transistor.

A circuit element may include a plurality of memory elements. A memory element may include, for example, a volatile semiconductor memory element and/or a non-volatile semiconductor memory element. The volatile semiconductor memory element may be, for example, a dynamic random-access memory (DRAM), a static random-access memory (SRAM), or the like. The non-volatile semiconductor memory element may be, for example, an erasable programmable read-only memory (EPROM), an electrically erasable programmable read-only memory (EEPROM), a Flash EEPROM, or the like.

Figure 15:
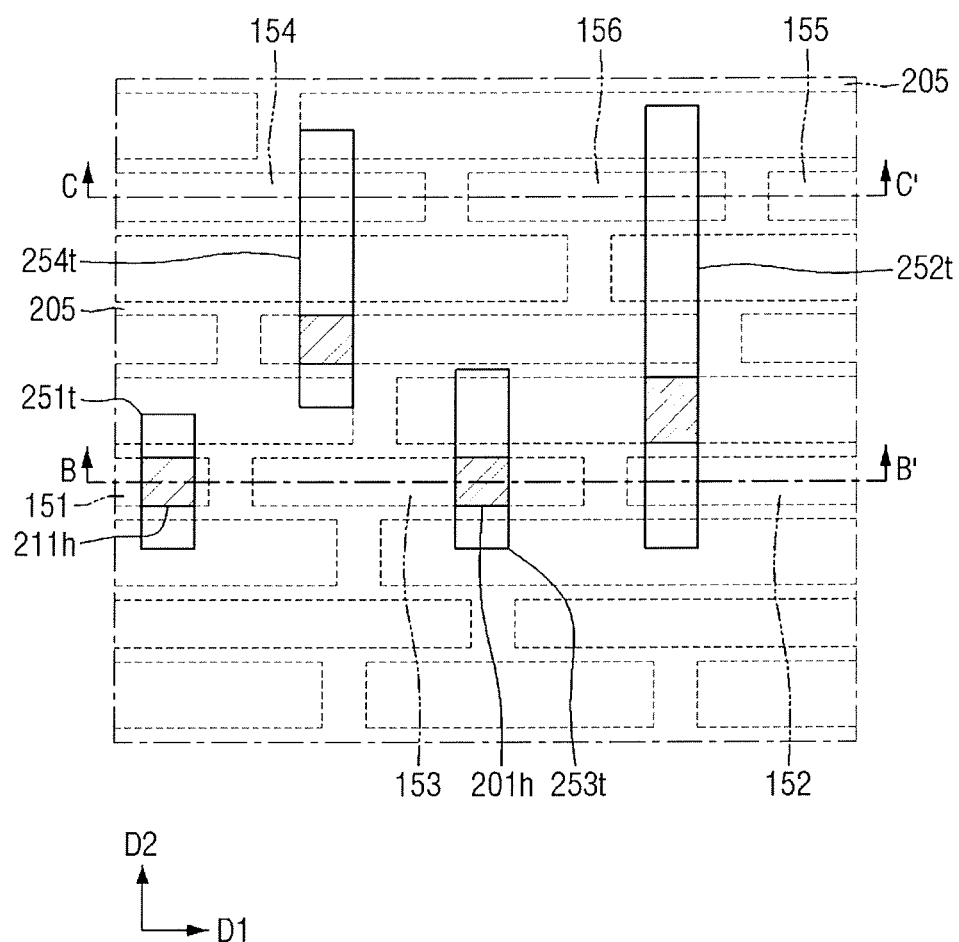
Figure 16:
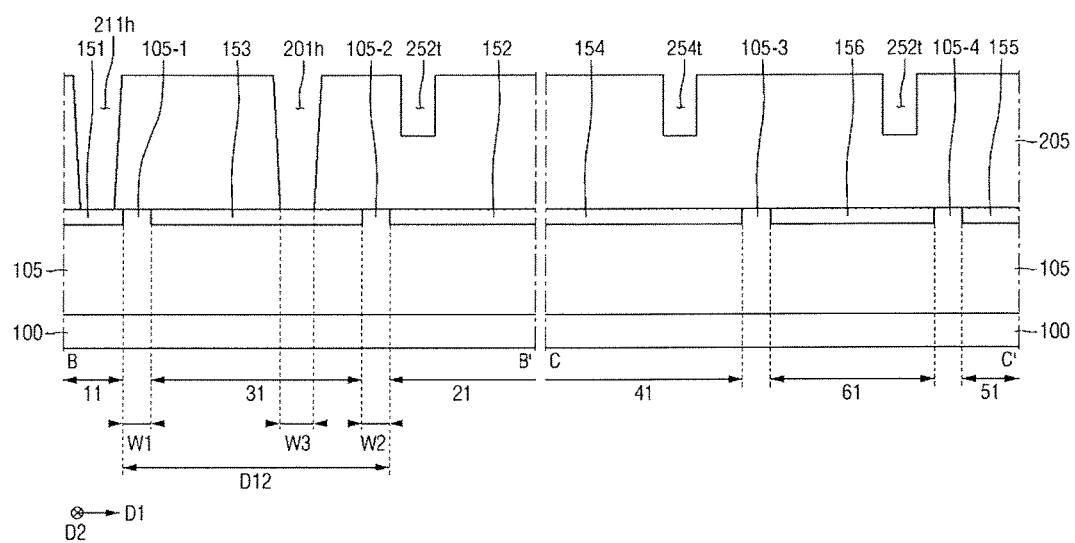

Referring to FIGS. 15 and 16, a second interlayer insulating film 205 may be formed on the first interlayer insulating film 105 and the first lower metal wiring 151 to the sixth lower metal wiring 156. The second interlayer insulating film 205 may include, for example, the same material as or a different material from the first interlayer insulating film 105.

The second interlayer insulating film 205 may include a first via hole 211h, a first dummy via hole 201h, and first to fourth trenches 251t to 254t.

The first via hole 211h may be formed in the second interlayer insulating film 205 to expose the top surface of the first lower metal wiring 151.

The first dummy via hole 201h may be formed in the second interlayer insulating film 205 to expose the top surface of the third lower metal wiring 153. The first dummy via hole 201h may be formed to not overlap both the first lower metal wiring 151 and the second lower metal wiring 152.

Although the side walls of the first via hole 211h and the first dummy via hole 201h are illustrated in the drawings to have a slope, the present inventive concept is not limited thereto. For example, the side walls of the first via hole 211h and the first dummy via hole 201h may also be perpendicular to the substrate 100.

The first trench 251t may be formed in the second interlayer insulating film 205 to overlap the first lower metal wiring 151. The second trench 252t may be formed in the second interlayer insulating film 205 to overlap the second lower metal wiring 152 and the sixth lower metal wiring 156. The third trench 253t may be formed in the second interlayer insulating film 205 to overlap the third lower metal wiring 153. The fourth trench 254t may be formed in the second interlayer insulating film 205 to overlap the fourth lower metal wiring 154. The side walls and bottom surfaces of the first to fourth trenches 251t to 254t may be defined by the second interlayer insulating film 205.

In the drawings, the extending length of the first to fourth trenches 251t to 254t is merely exemplary, and the present inventive concept is not limited thereto.

A distance D12 separating the first lower metal wiring 151 and the second lower metal wiring 152 may be greater than a sum of the width W1 of the first protrusion 105-1, the width W2 of the second protrusion 105-2 and the width W3 of the first dummy via hole 201h.

In other words, referring to FIG. 11, the distance D12 between the first lower metal wiring 151 and the second lower metal wiring 152 may be greater than a value obtained by combining the width W1 of the first block pattern 131, the width W2 of the second block pattern 132 and the width W3 of the first dummy via hole 201h. This is so because the width of the first block pattern 131 is the same as the width of the first protrusion 105-1, and the width of the second block pattern 132 is the same as the width of the second protrusion 105-2.

The distance D12 may be measured in the first direction D1. The width W1 of the first block pattern 131 or the first protrusion 105-1, the width W2 of the second block pattern 132 or the second protrusion 105-2 and the width W3 of the first dummy via hole 201h may be measured in the first direction D1.

Referring to FIGS. 15 and 16, the width W3 of the first dummy via hole 201h may measured in the first direction D1 along the top surface of the third lower metal wiring 153, exposed by the first dummy via hole 201h.

For example, when the distance D12 is equal to or smaller than the sum of the width W1 of the first protrusion 105-1, the width W2 of the second protrusion 105-2 and the width W3 of the first dummy via hole 201h, upper metal wirings to be formed in the subsequent process may be short-circuited with the lower metal wirings 151 to 156.

The distance D12 may be large enough to avoid short-circuiting of the lower metal wirings 151 to 156 with an upper metal wirings, to be described later, when the first dummy via hole 201h and the upper metal wirings are formed.

Figure 17:
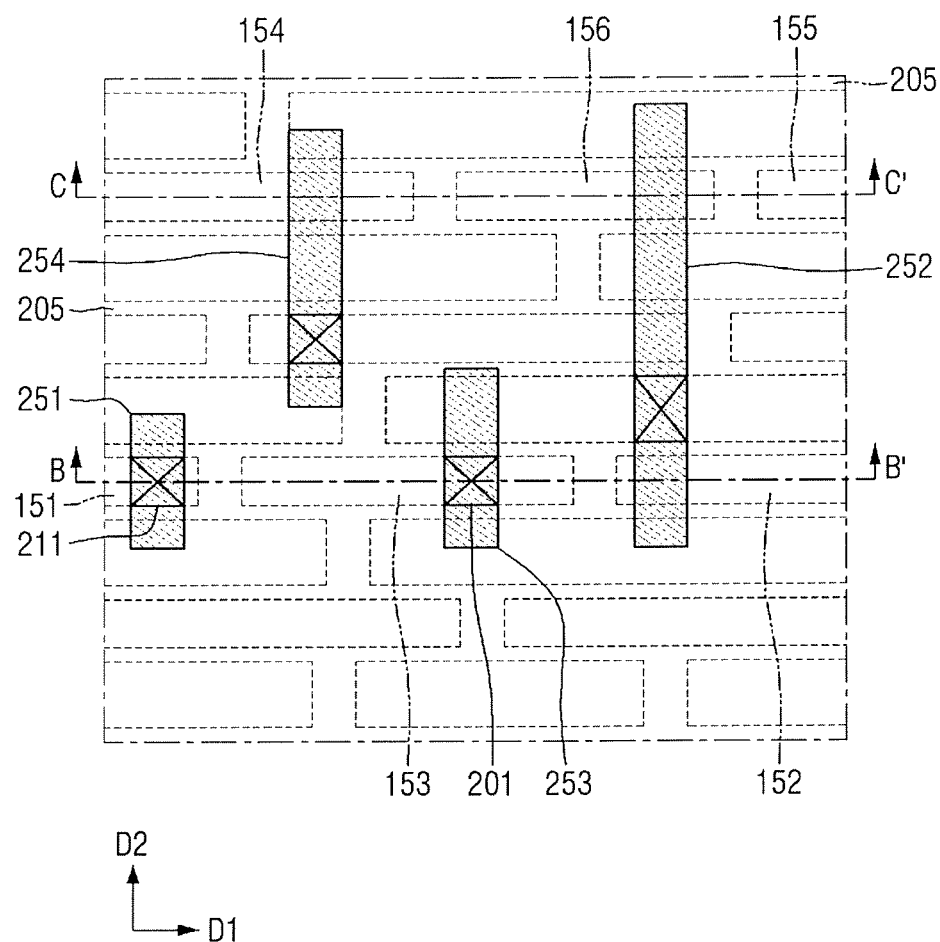
Figure 18:
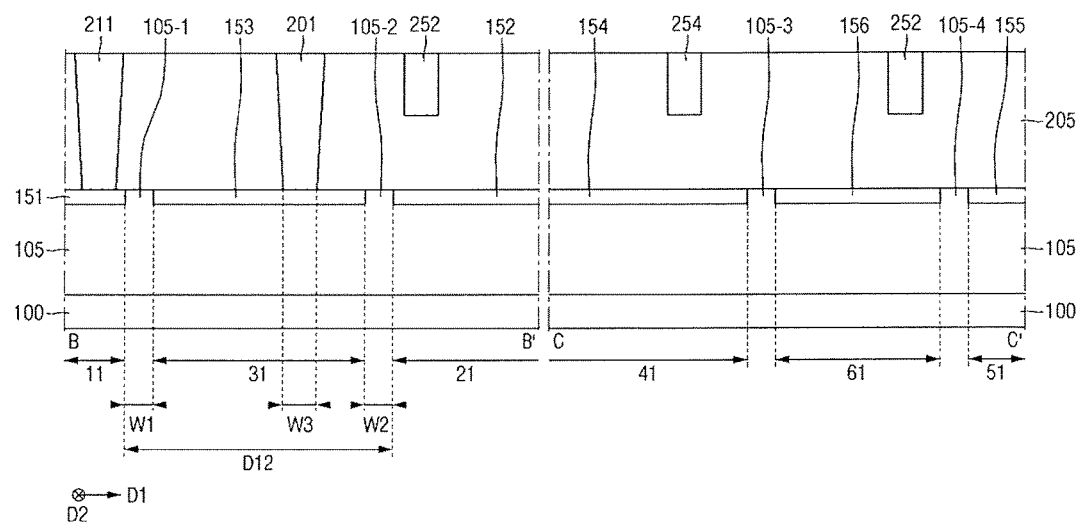

Referring to FIGS. 17 and 18, a first upper metal wiring 251, a second upper metal wiring 252, a third upper metal wiring 254 and a first upper dummy metal wiring 253 may be formed.

The first upper metal wiring 251 may be formed in the second interlayer insulating film 205 to fill the first trench 251t and the first via hole 211h. The first upper metal wiring 251 may be formed to overlap the first lower metal wiring 151. Accordingly, the first via 211 may be formed. The first via 211 may electrically connect the first lower metal wiring 151 and the first upper metal wiring 251.

The second upper metal wiring 252 may be formed in the second interlayer insulating film 205 to fill the second trench 252t. The second upper metal wiring 252 may be formed to overlap the second lower metal wiring 152 and the sixth lower metal wiring 156.

The third upper metal wiring 254 may be formed in the second interlayer insulating film 205 to fill the fourth trench 254t and to overlap the fourth lower metal wiring 154.

The first upper metal wiring 251, the second upper metal wiring 252 and the third upper metal wiring 254 are electrically connected to the lower metal wirings and may serve as a charge transfer passage.

The first upper metal wiring 251, the second upper metal wiring 252 and the third upper metal wiring 254 may be formed, for example, to not overlap the third lower metal wiring 153.

The first upper metal wiring 251, the second upper metal wiring 252 and the third upper metal wiring 254 may include, for example, a conductive material. The first upper metal wiring 251, the second upper metal wiring 252 and the third upper metal wiring 254 may include, for example, tungsten (W), aluminium (Al), copper (Cu), cobalt (Co) or a copper alloy. Here, the copper alloy may include C (carbon), Ag (silver), Co (cobalt), Ta (tantalum), In (indium), Sn (tin), Zn (zinc), Mn (manganese), Ti (titanium), Mg (magnesium), Cr (chromium), Ge (germanium), Sr (strontium), Pt (platinum), Al (aluminium) or Zr (zirconium) in the copper.

In a method for manufacturing the semiconductor device, according to an exemplary embodiment of the present inventive concept, although the first upper metal wiring 251, the second upper metal wiring 252 and the third upper metal wiring 254 are described as being metal wirings, the first upper metal wiring 251, the second upper metal wiring 252 and the third upper metal wiring 254 may be included, for example, in a transistor or a diode formed in the substrate 100. For example, the first upper metal wiring 251, the second upper metal wiring 252 and the third upper metal wiring 254 may be a gate electrode of the transistor or a source/drain of the transistor.

A circuit element may include a plurality of memory elements. A memory element may include, for example, a volatile semiconductor memory element and/or a non-volatile semiconductor memory element. The volatile semiconductor memory element may be, for example, a DRAM, an SRAM, or the like. The non-volatile semiconductor memory element may be, for example, an EPROM, an EEPROM, a Flash EEPROM, or the like.

The first upper dummy metal wiring 253 may be formed in the second interlayer insulating film 205 to fill the first dummy via hole 201h and the third trench 253t. Accordingly, the first dummy via 201 may be formed. The first dummy via 201 may connect the third lower metal wiring 153 and the first upper dummy metal wiring 253.

The first upper dummy metal wiring 253 may be formed to overlap the third lower metal wiring 153. In the drawings, although the first upper dummy metal wiring 253 is illustrated not to overlap the fourth lower metal wiring 154, the fifth lower metal wiring 155 or the sixth lower metal wiring 156, the present inventive concept is not limited thereto.

For example, in an exemplary embodiment of the present inventive concept, the first upper dummy metal wiring 253 may be formed to overlap the fourth lower metal wiring 154, the fifth lower metal wiring 155 or the sixth lower metal wiring 156. In other words, the first upper dummy metal wiring 253 may be, for example, formed to overlap the lower metal wiring which is disposed adjacent to the first upper dummy metal wiring 253 in the second direction D2.

The third lower metal wiring 153 may be formed to not overlap the first upper metal wiring 251, the second upper metal wiring 252 and the third upper metal wiring 254.

The first upper dummy metal wiring 253 may be formed to not overlap the first upper metal wiring 251, the second upper metal wiring 252 and the third upper metal wiring 254.

Although the third lower metal wiring 153 is connected to the first upper dummy metal wiring 253 through the first dummy via 201, the third lower metal wiring 153 may be electrically isolated from the first upper dummy metal wiring 253. Here, "electrically isolated", may mean, for example, that the third lower metal wiring 153 is not connected to a circuit pattern or a power supply, or is not used as an electrically-conductive wiring. Alternatively, the expression "electrically isolated", may mean, for example, that the third lower metal wiring 153 is not used as a medium that transfers an electrical charge. In other words, the third lower metal wiring 153 and the first upper dummy metal wiring 253 are electrically connected to each other but they are not used to conduct electricity.

The sixth lower metal wiring 156, for example, may overlap the second upper metal wiring 252. The second upper metal wiring 252 may be electrically connected to another lower metal wiring. In an exemplary embodiment of the present inventive concept, because the sixth lower metal wiring 156 overlaps the second upper metal wiring 252, the second upper metal wiring 252 being used as medium that transfers an electrical charge, a dummy via may not be formed on the sixth lower metal wiring 156. In other words, the sixth lower metal wiring 156 may be electrically non-connected to the second upper metal wiring 252 that overlaps the sixth lower metal wiring 156.

Here, the expression "electrically non-connected", may mean, for example, that the sixth lower metal wiring 156 is not electrically connected to an upper metal wiring, the upper metal wiring being used as a medium that transfers an electrical charge.

In the drawings, the sixth lower metal wiring 156 is illustrated to overlap only the second upper metal wiring 252, but the present inventive concept is not limited thereto. The sixth lower metal wiring 156, for example, may overlap any one of the upper metal wirings used as a medium that transfers an electrical charge. In this case, the sixth lower metal wiring 156 may be electrically isolated.

According to an exemplary embodiment of the present inventive concept, a method for manufacturing a semiconductor device may have an increased via density by forming metal wirings that include vias therein, without forming a separate dummy wiring by using an additional process. One or more of the metal wirings formed by using a method for manufacturing a semiconductor device, according to an exemplary embodiment of the present inventive concept, may be a metal wiring that does not include a conductive pattern region corresponding to the layout diagram. In other words, one or more metal wirings formed in a process may be a metal wiring that does not conduct electricity. The process may be, for example, an SADP process, but the present inventive concept is not limited thereto.

A method for manufacturing a semiconductor device, according to an exemplary embodiment of the present inventive concept, may increase the photo and etching process margin by increasing the via density by using metal wirings which include vias.

Hereinafter, a method for manufacturing a semiconductor device will be described with reference to FIGS. 1 to 14 and 19 to 22, according to an exemplary embodiment of the present inventive concept.

Figure 19:
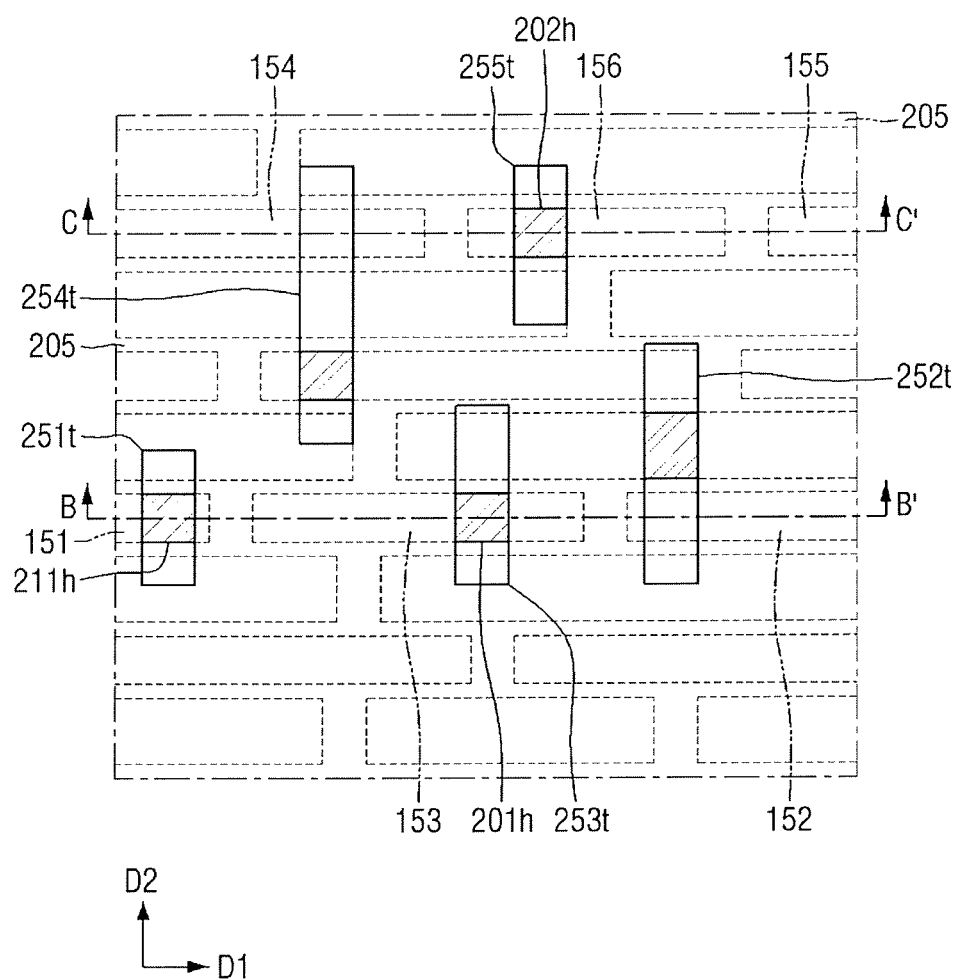
Figure 20:
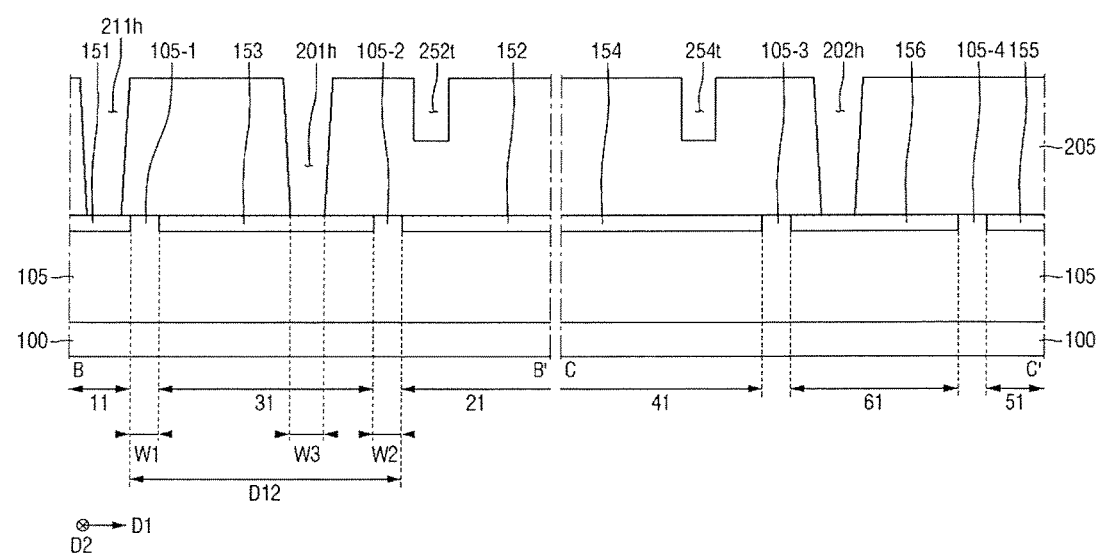
Figure 21:
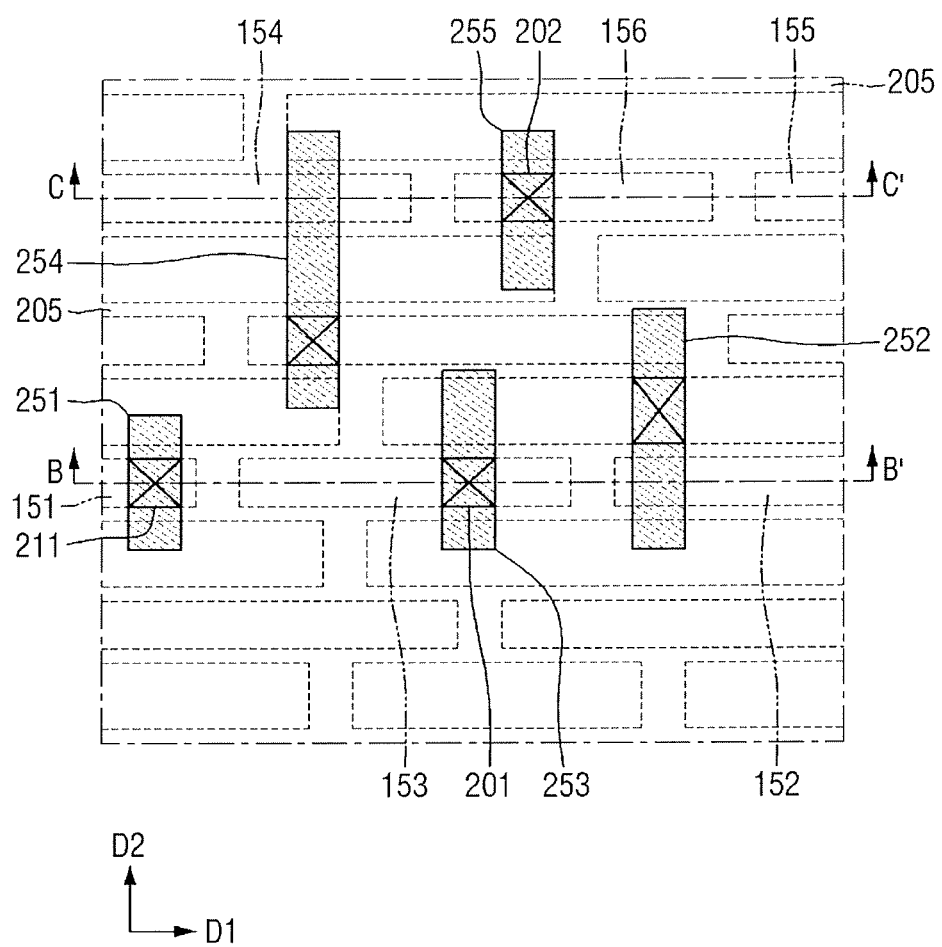
Figure 22:
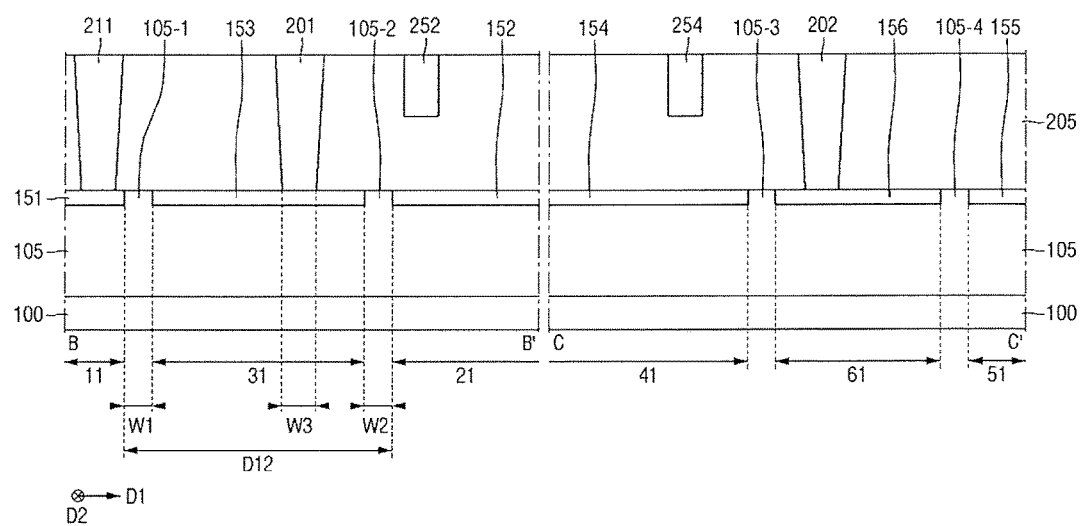
Figure 23:
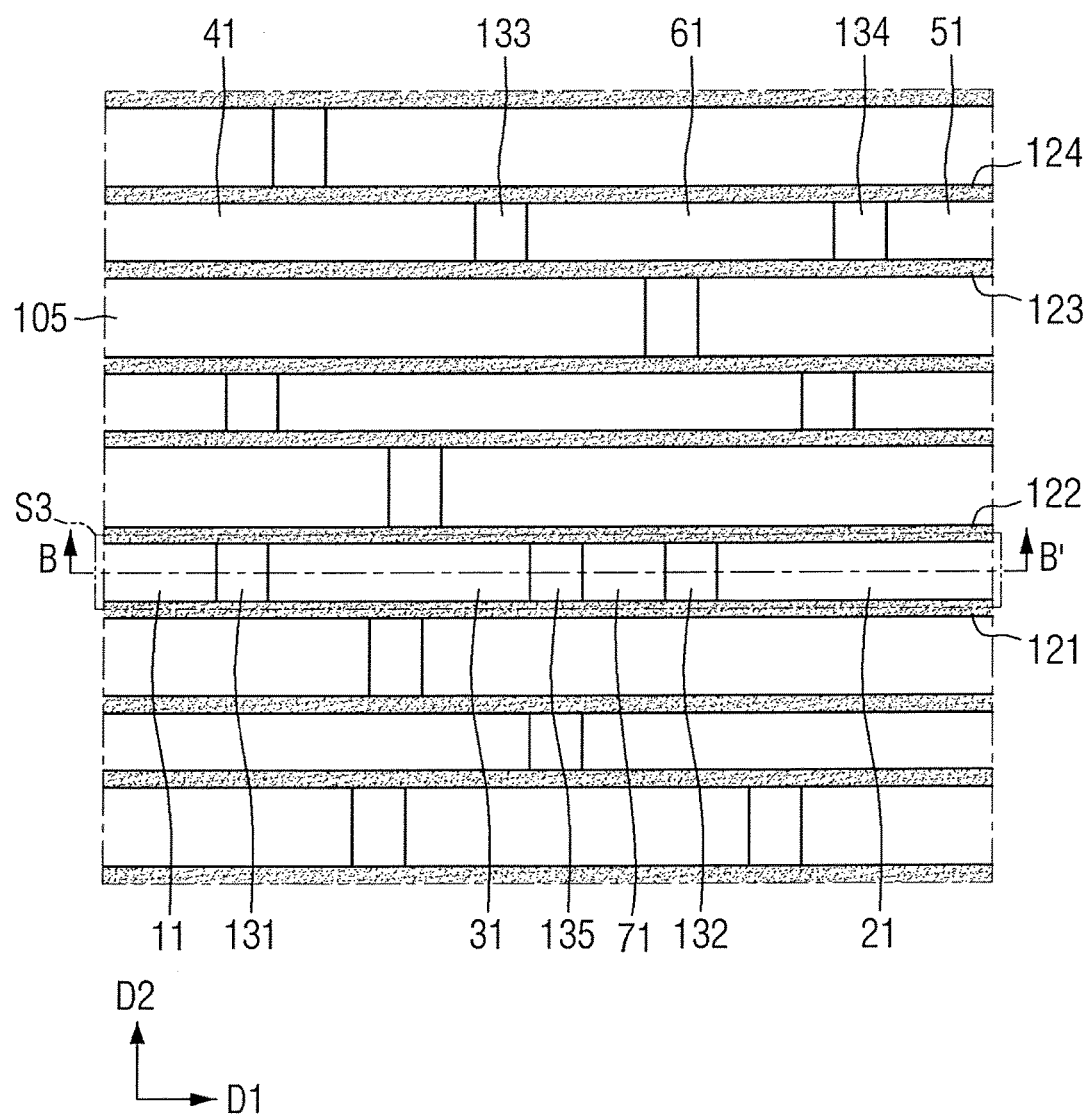
Figure 24:
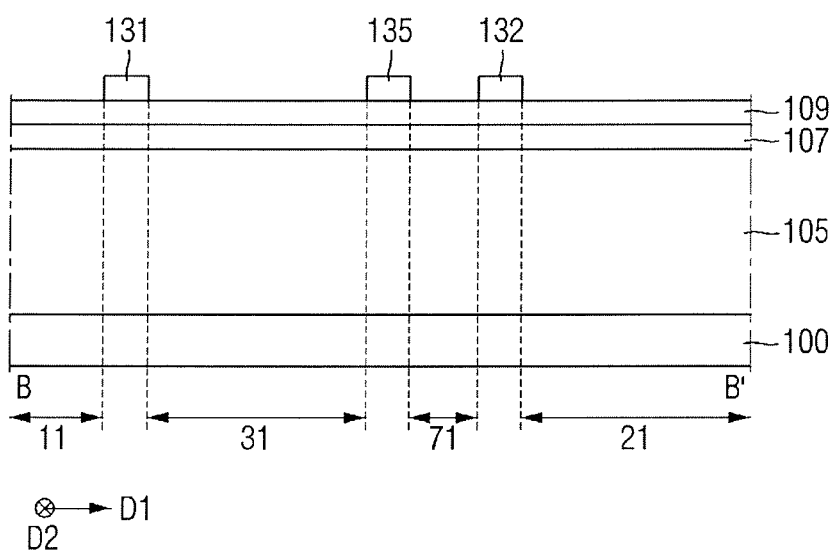

FIGS. 19 to 22 are plan and cross-sectional views of a method for manufacturing a semiconductor device, according to an exemplary embodiment of the present inventive concept. For example, FIGS. 19 to 22 illustrate a method for manufacturing a semiconductor device which uses the processes described with reference to FIGS. 1 to 14. FIGS. 19 and 21 are plan views. FIGS. 20 and 22 are cross-sectional views taken along the line B-B' and the line C-C' of FIGS. 19 and 21.

Referring to FIGS. 1 to 14 and 19 to 20, a second interlayer insulating film 205 may further include a fifth trench 255t and a second dummy via hole 202h.

The second trench 252t may not overlap the sixth lower metal wiring 156.

The fifth trench 255t may be formed to overlap the sixth lower metal wiring 156. The fifth trench 255t may not overlap the first trench 251t, the second trench 252t and the fourth trench 254t. The sixth lower metal wiring 156 may not overlap the first trench 251t, the second trench 252t and the fourth trench 254t.

The second dummy via hole 202h may be formed in the second interlayer insulating film 205 to expose the top surface of the sixth lower metal wiring 156. The second dummy via hole 202h may be formed to not overlap the fourth lower metal wiring 154 and the fifth lower metal wiring 155.

A distance between the fourth lower metal wiring 154 and the fifth lower metal wiring 155 may be, for example, larger than a sum of the width of the third protrusion 105-3, the width of the fourth protrusion 105-4 and the width of the second dummy via hole 202h.

The distance between the fourth lower metal wiring 154 and the fifth lower metal wiring 155 may be measured in the first direction D1. The width of the third protrusion 105-3, the width of the fourth protrusion 105-4 and the width of the second dummy via hole 202h may be measured in the first direction D1. The width of the second dummy via hole 202h may be measured at the top surface of the sixth lower metal wiring 156 in the first direction D1. The top surface of the sixth lower metal wiring 156 may be exposed by the second dummy via hole 202h.

Referring to FIGS. 21 and 22, the second upper dummy metal wiring 255 and the second dummy via 202 may be formed.

The second upper dummy metal wiring 255 may be formed in the second interlayer insulating film 205 to fill the fifth trench 255t and the second dummy via hole 202h. Accordingly, the second dummy via 202 may be formed. The second dummy via 202 may connect the sixth lower metal wiring 156 and the second upper dummy metal wiring 255.

The second upper dummy metal wiring 255 may be formed to overlap the sixth lower metal wiring 156. The second upper dummy metal wiring 255 may be formed to not overlap the first upper metal wiring 251, the second upper metal wiring 252 and the third upper metal wiring 254.

The sixth lower metal wiring 156 may be formed to not overlap the first upper metal wiring 251, the second upper metal wiring 252 and the third lower metal wiring 254.

Although the sixth lower metal wiring 156 is connected to the second upper dummy metal wiring 255 through the second dummy via 202, the sixth lower metal wiring 156 may be electrically isolated.

In an exemplary embodiment of the present inventive concept, the sixth lower metal wiring 156, for example, may not overlap the upper metal wirings which conduct electricity. In an exemplary embodiment of the present inventive concept, since the sixth lower metal wiring 156 does not overlap the upper metal wirings which conduct electricity, the second dummy via 202 may be formed.

Hereinafter, a method for manufacturing a semiconductor device will be described with reference to FIGS. 1 to 8, and 23 to 28, according to an exemplary embodiment of the present inventive concept.

FIGS. 23 to 28 are plan and cross-sectional views of a method for manufacturing a semiconductor device, according to an exemplary embodiment of the present inventive concept. For example, FIGS. 23 to 28 illustrate a method for manufacturing a semiconductor device which uses the processes described with reference to FIGS. 1 to 8. FIGS. 24 to 27 are cross-sectional views taken along the line B-B' of FIG. 23.

Referring to FIGS. 1 to 8, 23 and 24, a fifth block pattern 135 may be further formed on the first interlayer insulating film 105. For example, the fifth block pattern 135 may be formed on the hard mask 109.

The fifth block pattern 135 may be formed, for example, between the first spacer 121 and the second spacer 122. The fifth block pattern 135 may be formed between the first block pattern 131 and the second block pattern 132.

In an exemplary embodiment of the present inventive concept, the third region 31 may be exposed between the first block pattern 131 and the fifth block pattern 135. A seventh region 71 included in the first interlayer insulating film 105 may be a region that is not included in the layout of FIG. 1. In other words, the layout of FIG. 1 may not include a conductive pattern region corresponding to the seventh region 71.

The seventh region 71, the first region 11, the second region 21 and the third region 31 may be spaced apart from one another in the first direction D1. The fifth block pattern 135 may be formed on the first interlayer insulating film 105 between the third region 31 and the seventh region 71.

Figure 25:
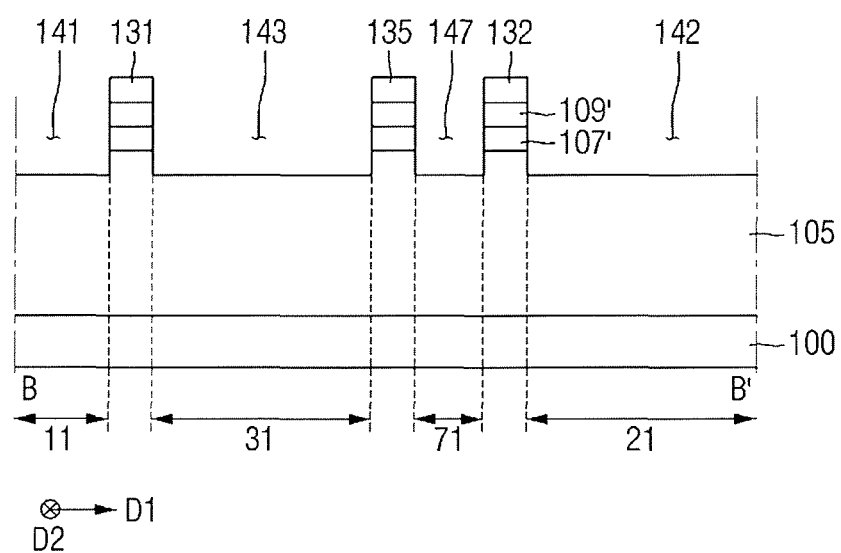
Figure 26:
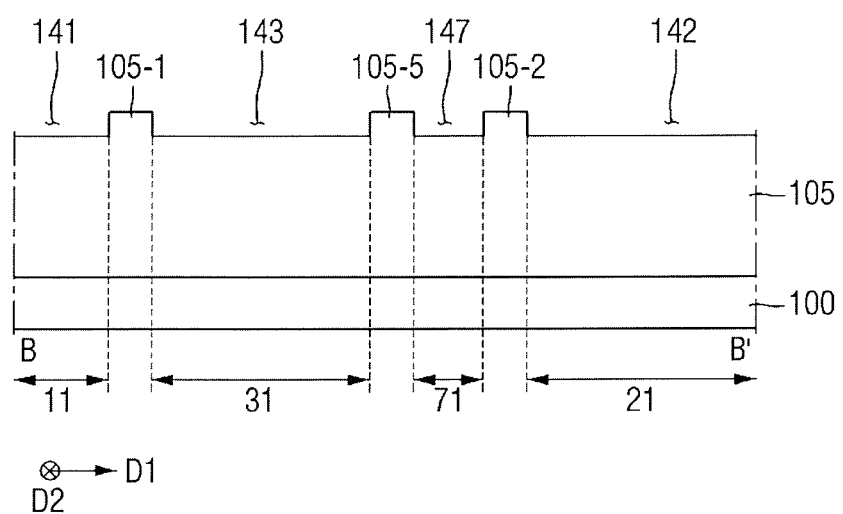

Referring to FIGS. 25 and 26, the first interlayer insulating film 105 is partially removed, and a seventh recess 147 may be formed in the first interlayer insulating film 105.

The hard mask 109, the barrier film 107 and the first interlayer insulating film 105 may be partially removed, using the first block pattern 131, the second block pattern 132 and the fifth block pattern 135 as masks. A seventh recess 147 may be formed between the second block pattern 132 and the fifth block pattern 135.

In addition, a fifth protrusion 105-5 may be formed on the first interlayer insulating film 105. The bottom surface of the seventh recess 147 may be defined by the first interlayer insulating film 105, and side walls of the seventh recess 147 may be defined by the fifth protrusion 105-5 and the second protrusion 105-2.

The fifth protrusion 105-5 may be formed between the first protrusion 105-1 and the second protrusion 105-2. The fifth protrusion 105-5 may be spaced apart from the first and second protrusions 105-1 and 105-2.

Figure 27:
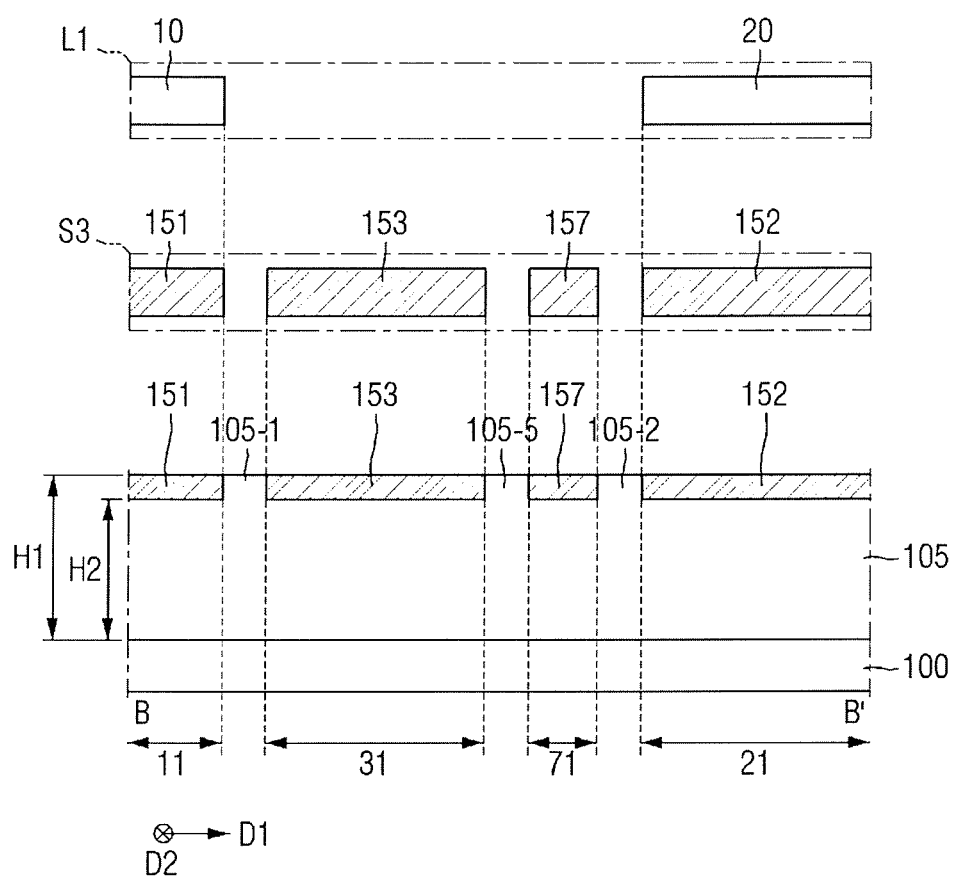

Referring to FIG. 27, a seventh lower metal wiring 157 may be formed on the first interlayer insulating film 105.

The seventh lower metal wiring 157 may be, for example, a wiring formed in the region S3 of the substrate 100. Referring to FIG. 13, the region S3 of the substrate 100 may be a region extending in the first direction D1, like the region S1 or the region S2.

The seventh lower metal wiring 157 may be, for example, a wiring formed in the region L1 of the layout diagram of FIG. 1. The pattern region corresponding to the seventh lower metal wiring 157 of the layout diagram of FIG. 1 may not be a conductive region. In other words, the seventh lower metal wiring 157 does not conduct electricity.

The seventh lower metal wiring 157 may be formed between the fifth protrusion 105-5 and the second protrusion 105-2. The seventh lower metal wiring 157 may be formed by filling the seventh recess 147.

Figure 28:
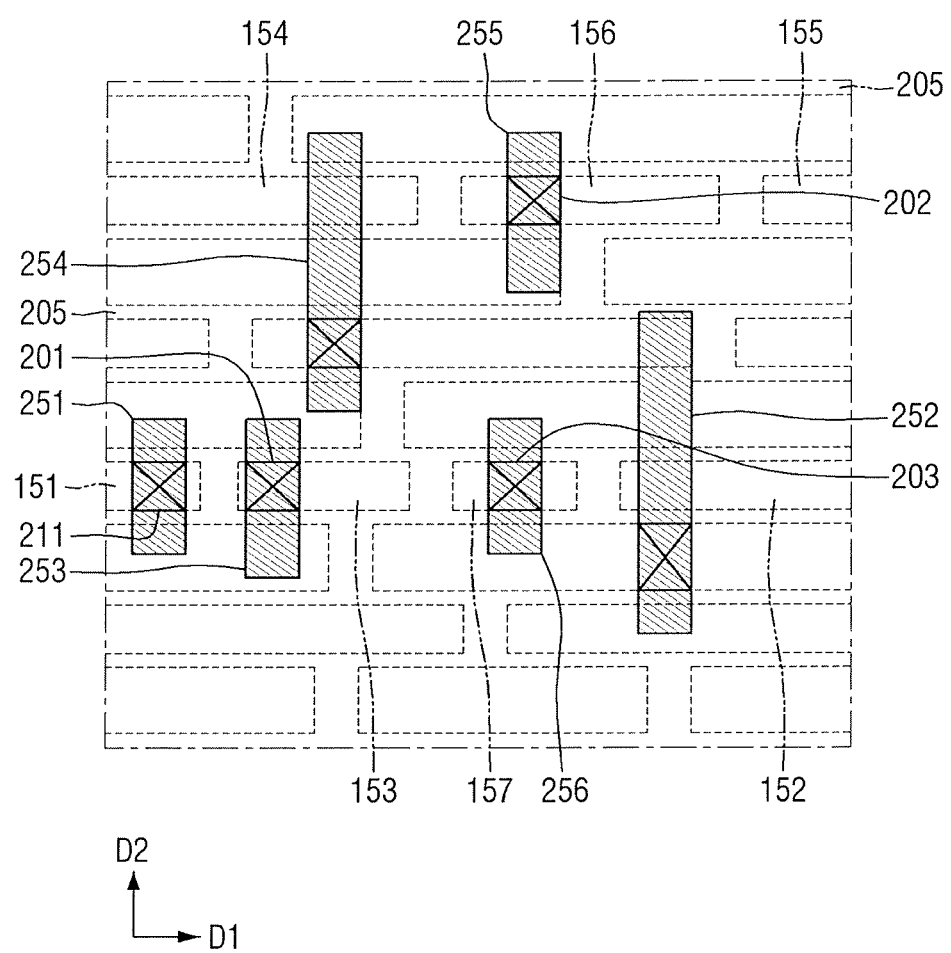

Referring to FIG. 28, a third upper dummy metal wiring 256 and a third dummy via 203 may be formed.

The process of forming the third upper dummy metal wiring 256 and the third dummy via 203 may be substantially the same as the process described above with reference to FIGS. 15 and 16. For example, the third dummy via hole for exposing the top surface of the seventh lower metal wiring 157 is formed in the second interlayer insulating film 205, and the third upper dummy metal wiring 256 may be formed by filling the third dummy via hole.

The third upper dummy metal wiring 256 may be formed in the second interlayer insulating film 205 to overlap the seventh lower metal wiring 157. The third dummy via 203 may connect the seventh lower metal wiring 157 and the third upper dummy metal wiring 256. Even if the seventh lower metal wiring 157 is connected to the third upper dummy metal wiring 256 through the third dummy via 203, the seventh lower metal wiring 157 may be electrically isolated.

The third upper dummy metal wiring 256 may not overlap the first upper metal wiring 251, the second upper metal wiring 252 and the third upper metal wiring 254. In other words, the third upper dummy metal wiring 256 may not overlap an upper metal wiring that is used to conduct electricity.

The seventh lower metal wiring 157 may not overlap the first upper metal wiring 251, the second upper metal wiring 252 and the third upper metal wiring 254.

A method for manufacturing a semiconductor device, according to an exemplary embodiment of the present inventive concept, may increase the density of a block pattern by adding a block pattern (e.g., the fifth block pattern 135) to a non-conductive region of the substrate 100. Thus, the via density may increase, and the margin of the photo and etching process may be increased.

Hereinafter, a method for manufacturing a semiconductor device will be described with reference to FIGS. 1 to 8, 23 to 27 and 29, according to an exemplary embodiment of the present inventive concept.

Figure 29:
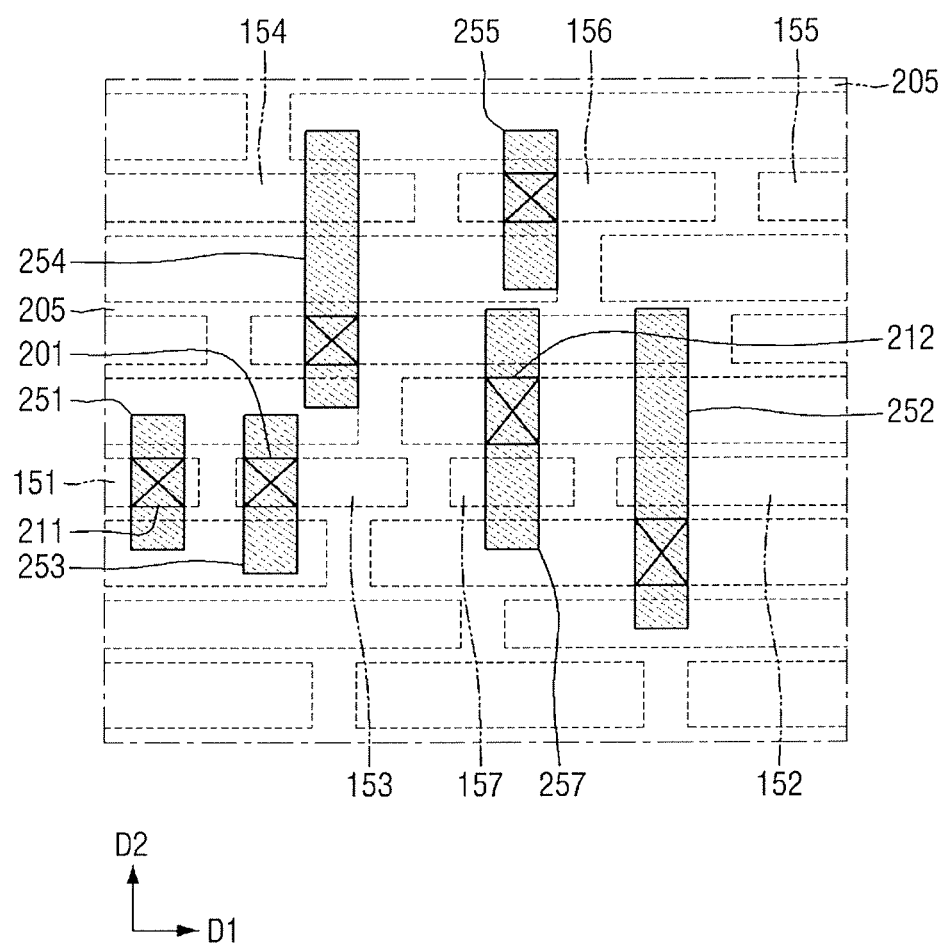

FIG. 29 is a plan view of a method for manufacturing a semiconductor device, according to an exemplary embodiment of the present inventive concept. For example, FIG. 29 illustrates a method for manufacturing a semiconductor device which uses the processes described with reference to FIGS. 1 to 8, and 23 to 27.

Referring to FIG. 29, a fourth upper metal wiring 257 may be formed to overlap a seventh lower metal wiring 157.

The fourth upper metal wiring 257 may be a wiring that is electrically connected to a lower metal wiring (e.g., the lower metal wiring 157) through the second via hole 212. For example, the fourth upper metal wiring 257 may be used to conduct electricity.

The seventh lower metal wiring 157 may be electrically non-connected to the fourth upper metal wiring 257.

Figure 30:
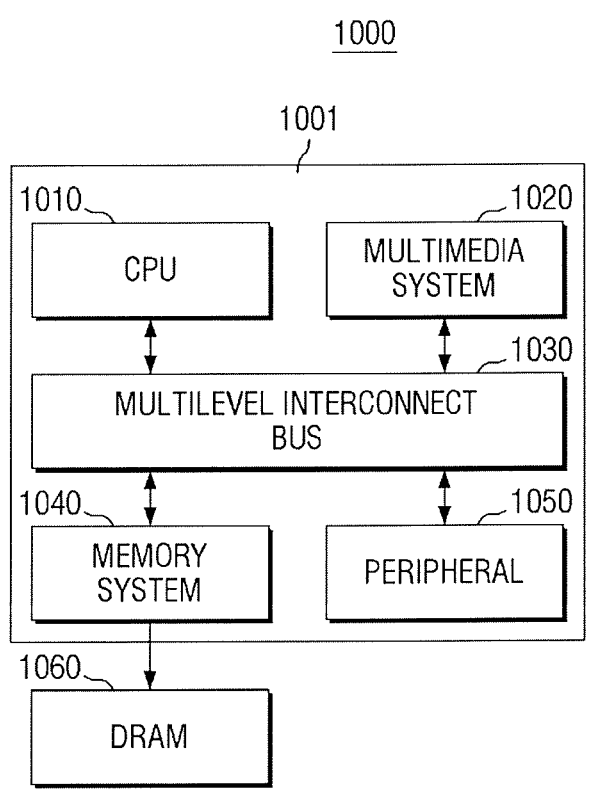
FIG. 30 is a block diagram of a system-on-a-chip (SoC) system including a semiconductor device manufactured according to the method of FIGS. 1 through 29, according to an exemplary embodiment of the present inventive concept.

Referring to FIG. 30, an SoC system 1000 includes an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform the operations required for driving the SoC system 1000. In an exemplary embodiment of the present inventive concept, the central processing unit 1010 may include a plurality of processing cores.

The multimedia system 1020 may be used to perform various multimedia functions in the SoC system 1000. The multimedia system 1020 may include a three dimensional (3D) engine module, a video codec, a display system, a camera system, a post-processor, and the like.

The bus 1030 may be used to perform a mutual data communication between the central processing unit 1010, the multimedia system 1020, the memory system 1040 and the peripheral circuit 1050. In an exemplary embodiment of the present inventive concept, the bus 1030 may have a multilayer structure. The bus 1030 may include a multilayer advanced high-performance bus (AHB), a multilayer advanced extensible interface (AXI), or the like.

The memory system 1040 may be used to create a high speed connection between the application processor 1001 and an external memory (e.g., the DRAM 1060). In an exemplary embodiment of the present inventive concept, the memory system 1040 may include a separate controller (e.g., a DRAM controller) needed to control the external memory (e.g., the DRAM 1060).

The peripheral circuit 1050 may be used to connect the SoC system 1000 to an external device (e.g., a main board). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In an exemplary embodiment of the present inventive concept, the DRAM 1060 may be disposed outside the application processor 1001, as illustrated in FIG. 30. In addition, the DRAM 1060 may be packaged with the application processor 1001 in the form of package on package (PoP).

At least one semiconductor device included in the SoC system 1000 may be manufactured according to the above-described methods, (e.g., the methods illustrated with reference to FIGS. 1 to 29).

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for manufacturing a semiconductor device, comprising:
   generating a layout including a first conductive pattern region and a second conductive pattern region spaced apart from each other in a first direction;
   forming a first interlayer insulating film on a substrate, the first interlayer insulating film comprising a first region corresponding to the first conductive pattern region, a second region corresponding to the second conductive pattern region, and a third region spaced apart from the first and second regions, wherein the third region is disposed between the first and second regions;
   forming a first block pattern and a second block pattern on the first interlayer insulating film, the first block pattern being disposed between the first region and the third region, and the second block pattern being disposed between the second region and the third region;
   partially removing the first interlayer insulating film using the first block pattern and the second block pattern as a mask to form a first recess in the first region, a second recess in the second region, and a third recess in the third region;
   forming first, second and third lower metal wirings that respectively fill the first, second and third recesses;
   forming a second interlayer insulating film on the first interlayer insulating film; and
   forming a first dummy via hole in the second interlayer insulating film, the first dummy via hole exposing a top surface of the third lower metal wiring, wherein the first dummy via hole does not overlap the first lower metal wiring and the second lower metal wiring,
   wherein the layout does not include a conductive pattern region corresponding to the third region,
   the third lower metal wiring is electrically isolated, and
   a distance between the first lower metal wiring and the second lower metal wiring is greater than a sum of a width of the first block pattern, a width of the second block pattern and a width of the first dummy via hole.

2. The method of claim 1, wherein the distance between the first lower metal wiring and the second lower metal wiring is measured in the first direction, and
   each of the width of the first block pattern, the width of the second block pattern and the width of the first dummy via hole is measured in the first direction.

3. The method of claim 1, further comprising:
   forming an upper metal wiring and a first upper dummy metal wiring within the second interlayer insulating film, the upper metal wiring overlapping the first lower metal wiring, and the first upper dummy metal wiring filling the first dummy via hole,
   wherein the first upper dummy metal wiring does not overlap the upper metal wiring, and
   the third lower metal wiring does not overlap the upper metal wiring.

4. The method of claim 1, wherein the first interlayer insulating film further comprises a fourth region spaced apart from the first region, the second region and the third region, wherein the fourth region is disposed between the first region and the second region,
   the method further comprising:
   forming a third block pattern disposed between the third region and the fourth region on the first interlayer insulating film;

partially removing the first interlayer insulating film using the third block pattern and the second block pattern as a mask to form a fourth recess in the fourth region; and forming a fourth lower metal wiring that fills the fourth recess, wherein the layout does not include a conductive pattern region corresponding to the fourth region, and the fourth lower metal wiring is electrically isolated.

5. The method of claim 4, further comprising:

forming a second dummy via hole in the second interlayer insulating film, the second dummy via hole exposing a top surface of the fourth lower metal wiring, wherein the second dummy via hole does not overlap the first lower metal wiring and the second lower metal wiring.

6. The method of claim 5, further comprising:

forming an upper metal wiring, a first upper dummy metal wiring and a second upper dummy metal wiring within the second interlayer insulating film, the upper metal wiring overlapping the first lower metal wiring, the first upper dummy metal wiring filling the first dummy via hole, and the second upper dummy metal wiring filling the second dummy via hole, wherein the first upper dummy metal wiring and the second upper dummy metal wiring do not overlap the upper metal wiring.

7. The method of claim 4, further comprising:

forming a first upper metal wiring, a second upper metal wiring and an upper dummy metal wiring within the second interlayer insulating film after forming the fourth lower metal wiring, wherein the first upper metal wiring overlaps the first lower metal wiring, the second upper metal wiring overlaps the fourth lower metal wiring, and the upper dummy metal wiring fills the first dummy via hole, wherein the upper dummy metal wiring does not overlap the first upper metal wiring and the second upper metal wiring, and wherein the fourth lower metal wiring is electrically insulated from the second upper metal wiring.

8. A method for manufacturing a semiconductor device, comprising:

generating a layout including a first conductive pattern region, a second conductive pattern region, a third conductive pattern region and a fourth conductive pattern region, the first conductive pattern region and the second conductive pattern region being spaced apart from each other in a first direction, and the third conductive pattern region and the fourth conductive pattern region being spaced apart from the first conductive pattern region and the second conductive pattern region in a second direction crossing the first direction, wherein the third and fourth conductive pattern regions are spaced part from each other in the first direction;

forming a first interlayer insulating film on a substrate;

forming a first protrusion, a second protrusion, a third protrusion and a fourth protrusion on the first interlayer insulating film, the second protrusion being spaced apart from the first protrusion in the first direction, the fourth protrusion being spaced apart from the third protrusion in the first direction, wherein the third protrusion and the fourth protrusion are spaced apart from the first protrusion and the second protrusion in the second direction;

forming a first lower metal wiring, a second lower metal wiring, a third lower metal wiring, a fourth lower metal wiring, a fifth lower metal wiring and a sixth lower metal wiring on the first interlayer insulating film, the first lower metal wiring corresponding to the first conductive pattern region, the second lower metal wiring corresponding to the second conductive pattern region, the fourth lower metal wiring corresponding to the third conductive pattern region, the fifth lower metal wiring corresponding to the fourth conductive pattern region, wherein the third lower metal wiring is disposed between the first protrusion and the second protrusion and the sixth lower metal wiring is disposed between the third protrusion and the fourth protrusion;

forming a second interlayer insulating film on the first interlayer insulating film; and forming a first dummy via hole in the second interlayer insulating film, the first dummy via hole exposing a top surface of the third lower metal wiring, wherein the first dummy via hole does not overlap the first lower metal wiring and the second lower metal wiring, wherein the third lower metal wiring and the sixth lower metal wiring do not conduct electricity, each of the third lower metal wiring and the sixth lower metal wiring is electrically isolated, and a distance between the first lower metal wiring and the second lower metal wiring is greater than a sum of a width of the first protrusion, a width of the second protrusion and a width of the first dummy via hole.

9. The method of claim 8, wherein a height from the substrate to a top surface of one of the first to fourth protrusions is greater than a height from the substrate to a top surface of the first interlayer insulating film.

10. The method of claim 8, further comprising:

forming a first upper metal wiring, a second upper metal wiring, a first upper dummy metal wiring and a third upper metal wiring in the second interlayer insulating film, the first upper metal wiring overlapping the first lower metal wiring, the second upper metal wiring overlapping the second lower metal wiring, the first upper dummy metal wiring filling the first dummy via hole, and the third upper metal wiring overlapping the fourth lower metal wiring, wherein the first upper dummy metal wiring does not overlap the first upper metal wiring, the second upper metal wiring and the third upper metal wiring, and the third lower metal wiring does not overlap the first upper metal wiring, the second upper metal wiring and the third upper metal wiring.

11. The method of claim 10, wherein the sixth lower metal wiring overlaps at least one of the first to third upper metal wirings, and the sixth lower metal wiring is electrically insulated from the first, second and third upper metal wirings.

12. The method of claim 10, wherein the first upper dummy metal wiring overlaps the fourth lower metal wiring or the fifth lower metal wiring.

13. The method of claim 10, further comprising:

forming a second dummy via hole in the second interlayer insulating film before forming the first, second and third upper metal wirings and the first upper dummy metal wiring, the second dummy via hole exposing a top surface of the sixth lower metal wiring, wherein the second dummy via hole does not overlap the fourth lower metal wiring and the fifth lower metal wiring; and forming a second upper dummy metal wiring filling the second dummy via hole, wherein the sixth lower metal wiring does not overlap the first upper metal wiring, the second upper metal wiring and the third upper metal wiring, and the second upper dummy metal wiring does not overlap the first upper metal wiring, the second upper metal wiring and the third upper metal wiring.

14. The method of claim 13, wherein a first distance between the fourth lower metal wiring and the fifth lower metal wiring is greater than a sum of a width of the third protrusion, a width of the fourth protrusion and a width of the second dummy via hole, the first distance is measured in the first direction, each of the width of the third protrusion, the width of the fourth protrusion and the width of the second dummy via hole is measured in the first direction, and the width of the second dummy via hole is the width of the top surface of the sixth lower metal wiring exposed by the second dummy via hole.

15. The method of claim 8, wherein, after forming the first interlayer insulating film, and before forming the first protrusion and the second protrusion, a first spacer, a second spacer, a third spacer and a fourth spacer are formed on the first interlayer insulating film, wherein the first to fourth spacers extend in the first direction, and wherein the first to fourth spacers are spaced apart from one another in a second direction crossing the first direction, wherein a region between the first protrusion and the second protrusion is exposed between the first spacer and the second spacer, and wherein a region between the third protrusion and the fourth protrusion is exposed between the third spacer and the fourth spacer.

16. A method for manufacturing a semiconductor device, comprising:

generating a layout of the semiconductor device, the layout including a first region, a second region and a third region spaced apart from each other in a first direction, wherein the third region is disposed between the first and second regions;

forming a first interlayer insulating film on a substrate;

forming a first recess in a first area of the first interlayer insulating film corresponding to the first region, forming a second recess in a second area of the first interlayer insulating film corresponding to the second region, and forming a third recess in a third area of the first interlayer insulating film corresponding to the third region;

forming first, second and third lower metal wirings respectively filling the first, second and third recesses;

forming a second interlayer insulating film on the first interlayer insulating film to cover the first, second and third lower metal wirings;

forming a first trench on the second interlayer insulating film, the first trench including a first dummy via hole which exposes the third lower metal wiring, wherein the first dummy via hole does not overlap the first lower metal wiring and the second lower metal wiring; and forming a first upper metal wiring to fill the first trench and the first dummy via hole, wherein the first upper metal wiring is electrically connected with the third lower metal wiring through the first dummy via hole, wherein the third lower metal wiring does not conduct electricity, and wherein a distance in the first direction between the first lower metal wiring and the second lower metal wiring is greater than a sum of a width of a first block pattern in the first direction, a width of a second block pattern in the first direction and a width of the first dummy via hole in the first direction.

17. The method of claim 16, wherein forming the first recess, the second recess and the third recess includes forming a first spacer and a second spacer on the first interlayer insulating film, wherein the first and second spacers extend in the first direction and are separated from each other along a second direction crossing the first direction;

forming the first block pattern and the second block pattern between the first and second spacers, wherein the third region is disposed between the first and second block patterns and the first and second spacers, the first region is disposed opposite to a side of the first block pattern facing the third region and between the first and second spacers, and the second region is disposed opposite to a side of the second block pattern facing the third region and between the first and second spacers; and partially removing the first interlayer insulating film using the first and second block patterns as a mask to form the first, second and third recesses.

18. The method of claim 16, wherein the first trench extends in a second direction crossing the first direction.

19. The method of claim 16, further comprising forming a second trench on the second interlayer insulating film, the second trench including a second dummy via hole which exposes the first lower metal wiring; and forming a second upper metal wiring to fill the second trench and the second dummy via hole, wherein the second upper metal wiring is electrically connected with the first lower metal wiring through the second dummy via hole.

20. The method of claim 19, wherein the second trench extends in a second direction crossing the first direction.

* * * * *